US008437482B2

(12) United States Patent
Seefeldt et al.

(10) Patent No.: US 8,437,482 B2
(45) Date of Patent: May 7, 2013

(54) METHOD, APPARATUS AND COMPUTER PROGRAM FOR CALCULATING AND ADJUSTING THE PERCEIVED LOUDNESS OF AN AUDIO SIGNAL

(75) Inventors: Alan Jeffrey Seefeldt, San Francisco, CA (US); Michael John Smithers, San Mateo, CA (US); Brett Graham Crockett, Brisbane, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 2 days.

(21) Appl. No.: 10/558,246

(22) PCT Filed: May 27, 2004

(86) PCT No.: PCT/US2004/016964
§ 371 (c)(1),
(2), (4) Date: Nov. 23, 2005

(87) PCT Pub. No.: WO2004/111994
PCT Pub. Date: Dec. 23, 2004

(65) Prior Publication Data
US 2007/0092089 A1    Apr. 26, 2007

Related U.S. Application Data

(60) Provisional application No. 60/474,077, filed on May 28, 2003.

(51) Int. Cl.
 H03G 3/00    (2006.01)
 H03G 7/00    (2006.01)
 H04R 29/00    (2006.01)

(52) U.S. Cl.
 USPC .............. 381/104; 381/106; 381/108; 381/56

(58) Field of Classification Search .................... 381/56, 381/320, 94.2, 57, 104–109, 312, 58, 60, 381/321; 704/224
See application file for complete search history.

(56) References Cited

U.S. PATENT DOCUMENTS
2,808,475 A    10/1957   Stryker
4,281,218 A     7/1981   Chuang et al.
(Continued)

FOREIGN PATENT DOCUMENTS
DE    43 35 739       5/1995
DE    198 48 491      4/2000
(Continued)

OTHER PUBLICATIONS

Bertsekas, Dimitri P., "Nonlinear Programming," 1995, Chapter 1.2 "Gradient Methods—Convergence," pp. 18-46.
(Continued)

Primary Examiner — Devona Faulk
Assistant Examiner — George Monikang

(57) ABSTRACT

One or a combination of two or more specific loudness model functions selected from a group of two or more of such functions are employed in calculating the perceptual loudness of an audio signal. The function or functions may be selected, for example, by a measure of the degree to which the audio signal is narrowband or wideband. Alternatively or with such a selection from a group of functions, a gain value G[t] is calculated, which gain, when applied to the audio signal, results in a perceived loudness substantially the same as a reference loudness. The gain calculating employs an iterative processing loop that includes the perceptual loudness calculation.

24 Claims, 10 Drawing Sheets

U.S. PATENT DOCUMENTS

| | | | |
|---|---|---|---|
| 4,543,537 A | 9/1985 | Kuhn et al. | |
| 4,739,514 A | 4/1988 | Short et al. | |
| 4,887,299 A | 12/1989 | Cummins et al. | |
| 5,027,410 A | 6/1991 | Williamson et al. | |
| 5,097,510 A | 3/1992 | Graupe | |
| 5,172,358 A | 12/1992 | Kimura | |
| 5,278,912 A | 1/1994 | Waldhauer | |
| 5,363,147 A | 11/1994 | Joseph et al. | |
| 5,369,711 A | 11/1994 | Williamson, III | |
| 5,377,277 A | 12/1994 | Bisping | |
| RE34,961 E | 6/1995 | Widin et al. | |
| 5,457,769 A | 10/1995 | Valley | |
| 5,500,902 A | 3/1996 | Stockham, Jr. et al. | |
| 5,530,760 A | 6/1996 | Paisley | |
| 5,548,638 A | 8/1996 | Yamaguchi et al. | |
| 5,583,962 A | 12/1996 | Davis et al. | |
| 5,615,270 A | 3/1997 | Miller et al. | |
| 5,632,005 A | 5/1997 | Davis et al. | |
| 5,633,981 A | 5/1997 | Davis | |
| 5,649,060 A | 7/1997 | Ellozy et al. | |
| 5,663,727 A | 9/1997 | Vokac | |
| 5,682,463 A | 10/1997 | Allen | |
| 5,712,954 A | 1/1998 | Dezonno | |
| 5,724,433 A | 3/1998 | Engebretson et al. | |
| 5,727,119 A | 3/1998 | Davidson et al. | |
| 5,819,247 A | 10/1998 | Freund et al. | |
| 5,822,018 A | 10/1998 | Farmer | |
| 5,848,171 A | 12/1998 | Stockham, Jr. et al. | |
| 5,862,228 A | 1/1999 | Davis | |
| 5,878,391 A | 3/1999 | Aarts | |
| 5,907,622 A | 5/1999 | Dougherty | |
| 5,909,664 A | 6/1999 | Davis et al. | |
| 6,002,776 A | 12/1999 | Bhadkamkar et al. | |
| 6,002,966 A | 12/1999 | Loeb et al. | |
| 6,021,386 A | 2/2000 | Davis et al. | |
| 6,041,295 A | 3/2000 | Hinderks | |
| 6,061,647 A | 5/2000 | Barrett | |
| 6,088,461 A | 7/2000 | Lin et al. | |
| 6,094,489 A | 7/2000 | Ishige et al. | |
| 6,108,431 A * | 8/2000 | Bachler | 381/312 |
| 6,125,343 A | 9/2000 | Schuster | |
| 6,148,085 A | 11/2000 | Jung | |
| 6,182,033 B1 | 1/2001 | Accardi et al. | |
| 6,185,309 B1 * | 2/2001 | Attias | 381/94.1 |
| 6,233,554 B1 | 5/2001 | Heimbigner et al. | |
| 6,240,388 B1 | 5/2001 | Fukuchi | |
| 6,263,371 B1 | 7/2001 | Geagan, III et al. | |
| 6,272,360 B1 | 8/2001 | Yamaguchi et al. | |
| 6,275,795 B1 | 8/2001 | Tzirkel-Hancock et al. | |
| 6,298,139 B1 | 10/2001 | Poulsen et al. | |
| 6,301,555 B2 | 10/2001 | Hinderks | |
| 6,311,155 B1 | 10/2001 | Vaudrey et al. | |
| 6,314,396 B1 | 11/2001 | Monkowski | |
| 6,327,366 B1 | 12/2001 | Uvacek et al. | |
| 6,332,119 B1 | 12/2001 | Hinderks | |
| 6,351,731 B1 | 2/2002 | Anderson et al. | |
| 6,351,733 B1 | 2/2002 | Saunders et al. | |
| 6,353,671 B1 | 3/2002 | Kandel et al. | |
| 6,370,255 B1 | 4/2002 | Schaub et al. | |
| 6,404,891 B1 * | 6/2002 | Seitz et al. | 381/107 |
| 6,411,927 B1 | 6/2002 | Morin et al. | |
| 6,430,533 B1 | 8/2002 | Kolluru et al. | |
| 6,442,278 B1 | 8/2002 | Vaudrey et al. | |
| 6,442,281 B2 | 8/2002 | Sato et al. | |
| 6,473,731 B2 | 10/2002 | Hinderks | |
| 6,498,855 B1 | 12/2002 | Kokkosoulis et al. | |
| 6,529,605 B1 | 3/2003 | Christoph | |
| 6,570,991 B1 | 5/2003 | Scheirer | |
| 6,625,433 B1 | 9/2003 | Poirier et al. | |
| 6,639,989 B1 | 10/2003 | Zacharov et al. | |
| 6,650,755 B2 | 11/2003 | Vaudrey et al. | |
| 6,651,041 B1 | 11/2003 | Juric | |
| 6,700,982 B1 | 3/2004 | Geurts et al. | |
| 6,807,525 B1 | 10/2004 | Li et al. | |
| 6,823,303 B1 | 11/2004 | Su et al. | |
| 6,889,186 B1 | 5/2005 | Michaelis | |
| 6,985,594 B1 | 1/2006 | Vaudrey et al. | |
| 7,065,498 B1 | 6/2006 | Thomas et al. | |
| 7,068,723 B2 | 6/2006 | Foote et al. | |
| 7,155,385 B2 | 12/2006 | Berestesky et al. | |
| 7,171,272 B2 * | 1/2007 | Blamey et al. | 607/57 |
| 7,212,640 B2 * | 5/2007 | Bizjak | 381/106 |
| 7,454,331 B2 | 11/2008 | Vinton | |
| 2001/0027393 A1 | 10/2001 | Touimi et al. | |
| 2002/0013698 A1 | 1/2002 | Vaudrey et al. | |
| 2002/0040295 A1 | 4/2002 | Saunders et al. | |
| 2002/0076072 A1 | 6/2002 | Cornelisse | |
| 2002/0097882 A1 | 7/2002 | Greenberg et al. | |
| 2002/0146137 A1 | 10/2002 | Kuhnel et al. | |
| 2002/0147595 A1 | 10/2002 | Baumgarte | |
| 2003/0002683 A1 | 1/2003 | Vaudrey et al. | |
| 2003/0035549 A1 * | 2/2003 | Bizjak et al. | 381/56 |
| 2004/0024591 A1 | 2/2004 | Boillot et al. | |
| 2004/0042617 A1 | 3/2004 | Beerends et al. | |
| 2004/0044525 A1 | 3/2004 | Vinton et al. | |
| 2004/0076302 A1 | 4/2004 | Christoph | |
| 2004/0122662 A1 | 6/2004 | Crockett | |
| 2004/0148159 A1 | 7/2004 | Crockett et al. | |
| 2004/0165730 A1 | 8/2004 | Crockett | |
| 2004/0172240 A1 | 9/2004 | Crockett et al. | |
| 2004/0184537 A1 | 9/2004 | Geiger et al. | |
| 2004/0190740 A1 | 9/2004 | Chalupper et al. | |
| 2004/0213420 A1 | 10/2004 | Gundry | |
| 2006/0002572 A1 | 1/2006 | Smithers et al. | |
| 2006/0215852 A1 | 9/2006 | Troxel | |
| 2007/0291959 A1 | 12/2007 | Seefeldt | |

FOREIGN PATENT DOCUMENTS

| | | |
|---|---|---|
| EP | 0 517 233 | 12/1992 |
| EP | 0 637 011 | 2/1995 |
| EP | 0 661 905 | 5/1995 |
| EP | 0 746 116 | 12/1996 |
| EP | 1 239 269 | 9/2002 |
| EP | 1 251 715 | 10/2002 |
| EP | 1 387 487 | 4/2004 |
| EP | 1 736 966 | 7/2007 |
| FR | 2 820 573 | 8/2002 |
| JP | 11-298990 A | 10/1999 |
| WO | WO/98/27543 | 6/1998 |
| WO | WO/00/78093 | 12/2000 |
| WO | WO/02/17678 | 2/2002 |
| WO | 03/015082 A1 | 2/2003 |
| WO | WO 03/090208 | 10/2003 |
| WO | WO 2004/019656 | 3/2004 |
| WO | WO 2004/073178 | 8/2004 |
| WO | WO 2004/111994 | 12/2004 |
| WO | WO 2005/086139 | 9/2005 |
| WO | WO 2005/104360 | 11/2005 |
| WO | WO 2006/019719 | 2/2006 |
| WO | WO 2006/047600 A1 | 4/2006 |
| WO | WO 2006/047600 | 5/2006 |
| WO | WO 2006/113047 | 10/2006 |
| WO | WO/2007/120452 | 10/2007 |
| WO | WO/2007/120453 | 10/2007 |
| WO | WO 2007/123608 | 11/2007 |
| WO | WO/2007/127023 | 11/2007 |
| WO | WO 2008/051347 | 5/2008 |
| WO | WO 2008/057173 | 5/2008 |
| WO | WO/2008/085330 | 7/2008 |
| WO | WO 2008/115445 | 9/2008 |
| WO | WO 2008/156774 | 12/2008 |

OTHER PUBLICATIONS

Bertsekas, Dimitri P., "Nonlinear Programming," 1995, Chapter 1.8 "Nonderivative Methods,", pp. 142-148.

Moore, BCJ, "Use of a loudness model for hearing aid fitting, IV. Fitting hearing aids with multi-channel compression so as to restore "normal" loudness for speech at different levels." British Journal of Audiology, vol. 34, No. 3, pp. 165-177, Jun. 2000, Whurr Publishers, UK.

Saunders, "Real-Time Discrimination of Broadcast Speech/Music," Proc. of Int. Conf. on Acoust. Speech and Sig. Proce., 1996, pp. 993-996.

Bosi, et al., "ISO/IEC MPEG-2 Advanced Audio coding," J. Audio Eng. Soc., vol. 45, No. 10, Oct. 1997, pp. 789-814.

Scheirer and Slaney, "Construction and Evaluation of a robust Multifeature Speech/Music Discriminator," Proc. of Int. Conf. on Acoust. Speech and Sig. Proc., 1997, pp. 1331-1334.

Schapire, "A Brief Introduction to Boosting," Proc. of the 16th Int. Joint Conference on Artificial Intelligence, 1999.

Guide to the Use of the ATSC Digital Television Standard, Dec. 4, 2003.

ISO Standard 532:1975, published 1975.

Belger, "The Loudness Balance of Audio Broadcast Programs," J. Audio Eng. Soc., vol. 17, No. 3, Jun. 1969, pp. 282-285.

Atkinson, I. A., et al., "Time Envelope LP Vocoder: A New Coding Technology at Very Low Bit Rates," 4th ed., 1995, ISSN 1018-4074, pp. 241-244.

Mapes, Riordan, et al., "Towards a model of Loudness Recalibration," 1997 IEEE ASSP workshop on New Paltz, NY USA, Oct. 19-22, 1997.

CEI/IEC Standard 60804 published Oct. 2000.

Blesser, Barry, "An Ultraminiature console Compression System with Maximum User Flexibility," Journal of Audio Engineering Society, vol. 20, No. 4, May 1972, pp. 297-302.

Hoeg, W., et al., "Dynamic Range Control (DRC) and Music/Speech Control (MSC) Programme-Associated Data Services for DAB", EBU Review-Technical, European Broadcasting Union, Brussels, BE, No. 261, Sep. 21, 1994.

Soulodre, GA, "Evaluation of Objective Loudness Meters" Preprints of Papers Presented at the 116th AES Convention, Berlin, Germany, May 8, 2004.

Notification of Transmittal of the International Search Report, PCT/US2007/08313), dated Sep. 21, 2007.

The Written Opinion of the International Searching Authority, PCT/US2007/08313), dated Sep. 21, 2007.

Notification of Transmittal of the International Search Report, PCT/US2007/007946, dated Aug. 21, 2007.

The Written Opinion of the International Searching Authority, PCT/US2007/007946, dated Aug. 21, 2007.

Notification of Transmittal of the International Search Report, PCT/US2007/007945, dated Aug. 17, 2007.

The Written Opinion of the International Searching Authority, PCT/US2007/007945, dated Aug. 17, 2007.

Notification of Transmittal of the International Search Report, PCT/US2007/0025747, dated Apr. 14, 2008.

The Written Opinion of the International Searching Authority, PCT/US2007/0025747, dated Apr. 14, 2008.

International Search Report, PCT/US2004/016964 dated Dec. 1, 2005.

Written Opinion of the International Searching Authority, PCT/US2004/016964 dated Dec. 1, 2005.

International Search Report, PCT/US2006/010823 dated Jul. 25, 2006.

Written Opinion of the International Searching Authority, PCT/US2006/010823 dated Jul. 25, 2006.

International Search Report, PCT/US2005/038579 dated Feb. 21, 2006.

Written Opinion of the International Searching Authority, PCT/US2005/038579 dated Feb. 21, 2006.

International Search Report, PCT/US2007/022132 dated Apr. 18, 2008.

Written Opinion of the International Searching Authority, PCT/US2007/022132 dated Apr. 18, 2008.

International Search Report, PCT/US2007/006444 dated Aug. 28, 2007.

Written Opinion of the International Searching Authority, PCT/US2007/006444 dated Aug. 28, 2007.

Notification of Transmittal of the International Search Report, PCT/US2008/007570, dated Sep. 10, 2008.

The Written Opinion of the International Searching Authority, PCT/US2008/007570, dated Sep. 10, 2008.

International Search Report, PCT/US2007/020747, dated May 21, 2008.

Mexican Patent Application No. PA/a/2005/002290—Response to Office Action dated Oct. 5, 2007.

Communication Under Rule 51(4) EPC, European Patent Office, EP Application No. 03791682.2-2218, dated Dec. 5, 2005.

Notification of the First Office Action, Chinese Application No. 03819918.1, dated Mar. 30, 2007.

Response to Notification of the First Office Action, Chinese Application No. 03819918.1, dated Aug. 14, 2007.

Response Office Action from the Israel Patent Office, Israel Patent Application No. 165,398, dated Dec. 29, 2008.

Official Letter from the Intellectual Property Bureau, Ministry of Economic Affairs, Taiwan, dated Mar. 21, 2008.

Response to Official Letter from the Intellectual Property Bureau, Ministry of Economic Affairs, Taiwan, dated Jun. 25, 2008.

Written Opinion of the intellectual Property Office of Singapore, Singapore Application No. 0702926-7, dated May 12, 2008.

European Patent Office, Office Action dated Apr. 2, 2008, EP Application No. 05818505.9.

European Patent Office, Response to Office Action dated Apr. 2, 2008, EP Application No. 05818505.9.

International Search Report, PCT/US2006/011202 dated Aug. 9, 2006.

Written Opinion of the International Searching Authority, PCT/US2006/011202 dated Aug. 9, 2006.

Japanese Office Action mailed Sep. 29, 2006.

"Government of India Patent Office", First Examination Report dated Jan. 6, 2010, Indian Application No. 2163/KOLNP/2005.

"European Patent Office", Extended European Search Report dated Feb. 19, 2008, EP Application No. 07013246.9.

"Japanese Patent Office", Reason for Rejection, mailed Sep. 29, 2009 (Translation Included), JP Application No. 2006-533502.

Japanese Office Action mailed Sep. 29, 2009 (date corrected).

Australian Government IP Australia, Examiner's first report on patent application No. 2005299410, mailed Jun. 25, 2009, Australian Patent Appln. No. 2005299410.

Israel Patent Office, Examiner's Report on Israel Application No. 182097 mailed Apr. 11, 2010, Israel Patent Appln. No. 182097.

Intellectual Property Corporation of Malaysia, Substantive/Modified Substantive Examination Adverse Report (Section 30(1)/30(2)) and Search Report, dated Dec. 5, 2008, Malaysian Patent Appln. No. PI 20055232.

Dept of Justice & Human Rights of Republic of Indonesia, Directorate General Intellectual Property Rights, First Office Action, Indonesian Patent Appln. No. WO0200701285.

State Intellectual Property Office of the People'S Republic of China, Notification of the Third Office Action, mailed Apr. 21, 2010, China Patent Appln. No. 200580036760.7.

European Patent Office Searching Authority, Int'l Search Report and Written Opinion, Int'l Appln. No. PCT/US2004/016964, mailed Jun. 20, 2005.

Seefeldt, et al.; "A New Objective Measure of Perceived Loudness," Audio Engineering Society (AES) 117th Convention, Paper 6236, Oct. 28-31, 2004, San Francisco, CA, pp. 1-8.

Chalupper, Josef; Aural Exciter and Loudness Maximizer: What's Psychoacoustic about "Psychoacoustic Processors?," Audio Engineering Society (AES) 108th Convention, Sep. 22-25, 2000, Los Angeles, CA, pp. 1-20.

Claro Digital Perception Processing; "Sound Processing with a Human Perspective," pp. 1-8, 1999.

Masciale, John M.; "The Difficulties in Evaluating A-Weighted Sound Level Measurements," S&V Observer, pp. 2-3, Apr. 2002.

Ghent, Jr., et al.; "Expansion as a Sound Processing Tool in Hearing Aids," American Academy of Audiology National Convention, Apr. 29-May 2, 1999, Miami Beach, FL.

Ghent, Jr., et al.; "Uses of Expansion to Promote Listening Comfort with Hearing Aids," American Academy of Audiology 12th Annual Convention, Mar. 16-19, 2000, Chicago, IL.

Martinez G., Isaac; "Automatic Gain Control (AGC) Circuits—Theory and Design," University of Toronto ECE1352 Analog Integrated Circuits I, Term Paper, Fall 2001, pp. 1-25.

Park, et al.; "High Performance Digital Hearing Aid Processor with Psychoacoustic Loudness Correction," IEEE FAM P3.1 0-7803-3734-4/97, pp. 312-313, 1997.

Bray, et al.; "Optimized Target Matching: Demonstration of an Adaptive Nonlinear DSP System," Sonic Innovations vol. 1 No. 2 1998, pp. 1-4, presented at the American Academy of Audiology, Los Angeles, CA, Apr. 4, 1998.

Bray, et al.; "An "Optimized" Platform for DSP Hearing Aids," Sonic Innovations, vol. 1 No. 3 1998, pp. 1-4, presented at the Conference on Advanced Signal Processing Hearing Aids, Cleveland, OH, Aug. 1, 1998.

Bray, et al.; "Digital Signal Processing (DSP) Derived from a Non-linear Auditory Model," Sonic Innovations, vol. 1 No. 1 1998, pp. 1-3, presented at American Academy of Audiology, Los Angeles, CA, Apr. 4, 1998.

Ghent, Jr., et al.; "Uses of Expansion to Promote Listening Comfort with Hearing Aids," Sonic Innovations, vol. 3 No. 2, 2000, pp. 1-4, presented at American Academy of Audiology 12th Annual Convention, Chicago, IL, Mar. 16-19, 2000.

Nilsson, et al.; "The Evolution of Multi-channel Compression Hearing Aids," Sonic Innovations, Presented at American Academy of Audiology 13th Convention, San Diego, CA, Apr. 19-22, 2001.

Johns, et al.; "An Advanced Graphic Equalizer Hearing Aid: Going Beyond Your Home Audio System," Sonic Innovations Corporation, Mar. 5, 2001, Http://www.audiologyonline.com/articles/pf_arc_disp.asp?id=279.

Smith, et al., "Tandem-Free VoIP Conferencing: A Bridge to Next-Generation Networks," IEEE Communications Magazine, IEEE Service Center, New York, NY, vol. 41, No. 5, May 2003, pp. 136-145.

H. H. Scott, "The Amplifier and Its Place in the High Fidelity System," J. Audio Eng. Soc., vol. 1, No. 3, Jul. 1953.

Nigro, et al., "Concert-Hall Realism through the Use of Dynamic Level Control," J. Audio Eng. Soc., vol. 1, No. 1, Jan. 1953.

Newcomb, et al., "Practical Loudness: an Active Circuit Design Approach," J. Audio eng. Soc., vol. 24, No. 1, Jan./Feb. 1976.

Robinson, et a., Dynamic Range Control via Metadata, 107th Convention of the AES, Sep. 14-27, 1999, New York.

Watson, et al., "Signal Duration and Signal Frequency in Relation to Auditory Sensitivity," Journal of the Acoustical Society of America, vol. 46, No. 4 (Part 2) 1969, pp. 989-997.

ATSC Standard A52/A: Digital Audio Compression Standard (AC-3), Revision A, Advanced Television Systems Committee, Aug. 20, 2001. The A/52A document is available on the World Wide Web at http://www./atsc.org._standards.html.

Todd, et al., "Flexible Perceptual Coding for Audio Transmission and Storage," 96th Convention of the Audio Engineering Society, Feb. 26, 1994, Preprint, 3796.

Davis, Mark, "The AC-3 Multichannel Coder," Audio engineering Society, Preprint 3774, 95th AES Convention, Oct. 1993.

Bosi, et al., "High Quality, Low-Rate Audio Transform Coding for Transmission and Multimedia Applications," Audio Engineering Society Preprint 3365, 93rd AES Convention, Oct. 1992.

Fielder, et al., "Introduction to Dolby Digital Plus, an Enhancement to the Dolby Digital Coding System," AES Convention Paper 6196, 117th AES Convention, Oct. 28, 2004.

Truman, et al., "Efficient Bit Allocation, Quantization, and Coding in an Audio Distribution System," AES Preprint 5068, 107th AES Conference, Aug. 1999.

Fielder, et al., "Professional Audio Coder Optimized fro Use with Video," AES Preprint 5033, 107th AES Conference, Aug. 1999.

Brandenburg, et al., "Overview of MPEG Audio: Current and Future Standards for Low-Bit-Rate Audio Coding," J. Audio eng. Soc., vol. 45, No. 1/2, Jan./Feb. 1997.

Vernon, Steve, "Design and Implementation of AC-3 Coders," IEEE Trans. Consumer Electronics, vol. 41, No. 3, Aug. 1995.

Crockett, et al., "A Method for Characterizing and Identifying Audio Based on Auditory Scene Analysis," Audio Engineering Society Convention Paper 6416, 118th Convention, Barcelona, May 28-31, 2005.

Crockett, Brett, "High Quality Multichannel Time Scaling and Pitch-Shifting using Auditory Scene Analysis," Audio Engineering Society Convention Paper 5948, New York, Oct. 2003.

Hauenstein M., "A Computationally Efficient Algorithm for Calculating Loudness Patterns of Narrowband Speech," Acoustics, Speech and Signal Processing 1997. 1997 IEEE International Conference, Munich Germany, Apr. 21-24, 1997, Los Alamitos, CA, USA, IEEE Comput. Soc., US, Apr. 21, 1997, pp. 1311-1314.

Cheng-Chieh Lee, "Diversity Control Among Multiple Coders: A Simple Approach to Multiple Descriptions," IEE, Sep. 2000.

Moore, et al., "A Model for the Prediction of Thresholds, Loudness and Partial Loudness," Journal of the Audio Engineering Society, Audio Engineering Society, New York, vol. 45, No. 4, Apr. 1997, pp. 224-240.

Glasberg, et al., "A Model of Loudness Applicable to Time-Varying Sounds," Journal of the Audio Engineering Society, Audio Engineering Society, New York, vol. 50, No. 5, May 2002, pp. 331-342.

Hauenstein M., "A Computationally Efficient Algorithm for Calculating Loudness Patterns of Narrowband Speech," Acoustics, Speech and Signal Processing, 1997. ICASSP-97., 1997 IEEE International Conference on Munich, Germany Apr. 21-24, 1997, Los Alamitos, CA, IEEE Comput. Soc., US, Apr. 21, 1997, pp. 1311-1314.

Stevens, "Calculations of the Loudness of Complex Noise," Journal of the Acoustical Society of America, 1956.

Zwicker, "Psychological and Methodical Basis of Loudness," Acoustica, 1958.

Australian Broadcasting Authority (ABA), "Investigation into Loudness of Advertisements," Jul. 2002.

Zwicker, et al., "Psychoacoustics—Facts and Models," Springer-Verlag, Chapter 8, "Loudness," pp. 203- 238, Berlin Heidelberg, 1990, 1999.

Lin, L., et al., "Auditory Filter Bank Design Using Masking Curves," 7th European Conference on Speech Communications and Technology, Sep. 2001.

ISO226 : 1987 (E), "Acoustics—Normal Equal Loudness Level Contours.".

Seefeldt, et al., "A New Objective Measure of Perceived Loudness," Audio Engineering Society, Convention Paper 6236, 117th Convention, San Francisco, CA. Oct. 28-31, 2004.

Seo, et al., "Auditory Model Design for Objective Audio Quality Measurement," Department of Electronic Engineering, Dongguk University, Seoul Korea, 2002.

Mouton, Dave, "Loud, Louder, Loudest!," Electronic Musician, Aug. 1, 2003.

Riedmiller, Jeff, "Working Toward Consistency in Program Loudness," Broadcast Engineering, Jan. 1, 2004.

Robinson, et al., "Time-Domain Auditory Model for the Assessment of High-Quality Coded Audio," 107th AES Convention, Sep. 1999.

Hermesand, et al., "Sound Design—Creating the Sound for Complex Systems and Virtual Objects," Chapter II, "Anatomy and Psychoacoustics," 2003-2004.

\* cited by examiner

METHOD, APPARATUS AND COMPUTER PROGRAM FOR CALCULATING AND ADJUSTING THE PERCEIVED LOUDNESS OF AN AUDIO SIGNAL

TECHNICAL FIELD

The present invention is related to loudness measurements of audio signals and to apparatuses, methods, and computer programs for controlling the loudness of audio signals in response to such measurements.

BACKGROUND ART

Loudness is a subjectively perceived attribute of auditory sensation by which sound can be ordered on a scale extending from quiet to loud. Because loudness is a sensation perceived by a listener, it is not suited to direct physical measurement, therefore making it difficult to quantify. In addition, due to the perceptual component of loudness, different listeners with "normal" hearing may have different perceptions of the same sound. The only way to reduce the variations introduced by individual perception and to arrive at a general measure of the loudness of audio material is to assemble a group of listeners and derive a loudness figure, or ranking, statistically. This is clearly an impractical approach for standard, day-to-day, loudness measurements.

There have been many attempts to develop a satisfactory objective method of measuring loudness. Fletcher and Munson determined in 1933 that human hearing is less sensitive at low and high frequencies than at middle (or voice) frequencies. They also found that the relative change in sensitivity decreased as the level of the sound increased. An early loudness meter consisted of a microphone, amplifier, meter and a combination of filters designed to roughly mimic the frequency response of hearing at low, medium and high sound levels.

Even though such devices provided a measurement of the loudness of a single, constant level, isolated tone, measurements of more complex sounds did not match the subjective impressions of loudness very well. Sound level meters of this type have been standardized but are only used for specific tasks, such as the monitoring and control of industrial noise.

In the early 1950s, Zwicker and Stevens, among others, extended the work of Fletcher and Munson in developing a more realistic model of the loudness perception process. Stevens published a method for the "Calculation of the Loudness of Complex Noise" in the Journal of the Acoustical Society of America in 1956, and Zwicker published his "Psychological and Methodical Basis of Loudness" article in Acoustica in 1958. In 1959 Zwicker published a graphical procedure for loudness calculation, as well as several similar articles shortly after. The Stevens and Zwicker methods were standardized as ISO 532, parts A and B (respectively). Both methods incorporate standard psychoacoustic phenomena such as critical banding, frequency masking and specific loudness. The methods are based on the division of complex sounds into components that fall into "critical bands" of frequencies, allowing the possibility of some signal components to mask others, and the addition of the specific loudness in each critical band to arrive at the total loudness of the sound.

Recent research, as evidenced by the Australian Broadcasting Authority's (ABA) "Investigation into Loudness of Advertisements" (July 2002), has shown that many advertisements (and some programs) are perceived to be too loud in relation to the other programs, and therefore are very annoying to the listeners. The ABA's investigation is only the most recent attempt to address a problem that has existed for years across virtually all broadcast material and countries. These results show that audience annoyance due to inconsistent loudness across program material could be reduced, or eliminated, if reliable, consistent measurements of program loudness could be made and used to reduce the annoying loudness variations.

The Bark scale is a unit of measurement used in the concept of critical bands. The critical-band scale is based on the fact that human hearing analyses a broad spectrum into parts that correspond to smaller critical sub-bands. Adding one critical band to the next in such a way that the upper limit of the lower critical band is the lower limit of the next higher critical band, leads to the scale of critical-band rate. If the critical bands are added up this way, then a certain frequency corresponds to each crossing point. The first critical band spans the range from 0 to 100 Hz, the second from 100 Hz to 200 Hz, the third from 200 Hz to 300 Hz and so on up to 500 Hz where the frequency range of each critical band increases. The audible frequency range of 0 to 16 kHz can be subdivided into 24 abutting critical bands, which increase in bandwidth with increasing frequency. The critical bands are numbered from 0 to 24 and have the unit "Bark", defining the Bark scale. The relation between critical-band rate and frequency is important for understanding many characteristics of the human ear. See, for example, *Psychoacoustics—Facts and Models* by E. Zwicker and H. Fastl, Springer-Verlag, Berlin, 1990.

The Equivalent Rectangular Bandwidth (ERB) scale is a way of measuring frequency for human hearing that is similar to the Bark scale. Developed by Moore, Glasberg and Baer, it is a refinement of Zwicker's loudness work. See Moore, Glasberg and Baer (B. C. J. Moore, B. Glasberg, T. Baer, "A Model for the Prediction of Thresholds, Loudness, and Partial Loudness," *Journal of the Audio Engineering Society*, Vol. 45, No. 4, April 1997, pp. 224-240). The measurement of critical bands below 500 Hz is difficult because at such low frequencies, the efficiency and sensitivity of the human auditory system diminishes rapidly. Improved measurements of the auditory-filter bandwidth have lead to the ERB-rate scale. Such measurements used notched-noise maskers to measure the auditory filter bandwidth. In general, for the ERB scale the auditory-filter bandwidth (expressed in units of ERB) is smaller than on the Bark scale. The difference becomes larger for lower frequencies.

The frequency selectivity of the human hearing system can be approximated by subdividing the intensity of sound into parts that fall into critical bands. Such an approximation leads to the notion of critical band intensities. If instead of an infinitely steep slope of the hypothetical critical band filters, the actual slope produced in the human hearing system is considered, then such a procedure leads to an intermediate value of intensity called excitation. Mostly, such values are not used as linear values but as logarithmic values similar to sound pressure level. The critical-band and excitation levels are the corresponding values that play an important role in many models as intermediate values. (See *Psychoacoustics— Facts and Models*, supra).

Loudness level may be measured in units of "phon". One phon is defined as the perceived loudness of a 1 kHz pure sine wave played at 1 dB sound pressure level (SPL), which corresponds to a root mean square pressure of $2 \times 10^{-5}$ Pascals. N Phon is the perceived loudness of a 1 kHz tone played at N dB SPL. Using this definition in comparing the loudness of tones at frequencies other than 1 kHz with a tone at 1 kHz, a contour of equal loudness can be determined for a given level of phon. FIG. 7 shows equal loudness level contours for frequencies between 20 Hz and 12.5 kHz, and for phon levels between 4.2 phon (considered to be the threshold of hearing) and 120 phon (ISO226: 1987 (E), "Acoustics—Normal Equal Loudness Level Contours").

Loudness level may also be measured in units of "sone". There is a one-to-one mapping between phon units and sone units, as indicated in FIG. 7. One sone is defined as the loudness of a 40 dB (SPL) 1 kHz pure sine wave and is equivalent to 40 phon. The units of sone are such that a twofold increase in sone corresponds to a doubling of perceived loudness. For example, 4 sone is perceived as twice as loud as 2 sone. Thus, expressing loudness levels in sone is more informative.

Because sone is a measure of loudness of an audio signal, specific loudness is simply loudness per unit frequency. Thus when using the bark frequency scale, specific loudness has units of sone per bark and likewise when using the ERB frequency scale, the units are sone per ERB.

Throughout the remainder of this document, terms such as "filter" or "filterbank" are used herein to include essentially any form of recursive and non-recursive filtering such as IIR filters or transforms, and "filtered" information is the result of applying such filters. Embodiments described below employ filterbanks implemented by IIR filters and by transforms.

DISCLOSURE OF THE INVENTION

According to an aspect of the present invention, a method for processing an audio signal includes producing, in response to the audio signal, an excitation signal, and calculating the perceptual loudness of the audio signal in response to the excitation signal and a measure of characteristics of the audio signal, wherein the calculating selects, from a group of two or more specific loudness model functions, one or a combination of two or more of the specific loudness model functions, the selection of which is controlled by the measure of characteristics of the input audio signal.

According to another aspect of the present invention, a method for processing an audio signal includes producing, in response to the audio signal, an excitation signal, and calculating, in response at least to the excitation signal, a gain value G[t], which, if applied to the audio signal, would result in a perceived loudness substantially the same as a reference loudness, the calculating including an iterative processing loop that includes at least one non-linear process.

According to yet another aspect of the present invention, a method for processing a plurality of audio signals includes a plurality of processes, each receiving a respective one of the audio signals, wherein each process produces, in response to the respective audio signal, an excitation signal, calculates, in response at least to the excitation signal, a gain value G[t], which, if applied to the audio signal, would result in a perceived loudness substantially the same as a reference loudness, the calculating including an iterative processing loop that includes at least one non-linear process, and controls the amplitude of the respective audio signal with the gain G[t] so that the resulting perceived loudness of the respective audio signal is substantially the same as the reference loudness, and applying the same reference loudness to each of the plurality of processes.

In an embodiment that employs aspects of the invention, a method or device for signal processing receives an input audio signal. The signal is linearly filtered by a filter or filter function that simulates the characteristics of the outer and middle human ear and a filterbank or filterbank function that divides the filtered signal into frequency bands that simulate the excitation pattern generated along the basilar membrane of the inner ear. For each frequency band, the specific loudness is calculated using one or more specific loudness functions or models, the selection of which is controlled by properties or features extracted from the input audio signal. The specific loudness for each frequency band is combined into a loudness measure, representative of the wideband input audio signal. A single value of the loudness measure may be calculated for some finite time range of the input signal, or the loudness measure may be repetitively calculated on time intervals or blocks of the input audio signal.

In another embodiment that employs aspects of the invention, a method or device for signal processing receives an input audio signal. The signal is linearly filtered by a filter or filter function that simulates the characteristics of the outer and middle human ear and a filterbank or filterbank function that divides the filtered signal into frequency bands that simulate the excitation pattern generated along the basilar membrane of the inner ear. For each frequency band, the specific loudness is calculated using one or more specific loudness functions or models; the selection of which is controlled by properties or features extracted from the input audio signal. The specific loudness for each frequency band is combined into a loudness measure; representative of the wideband input audio signal. The loudness measure is compared with a reference loudness value and the difference is used to scale or gain adjust the frequency-banded signals previously input to the specific loudness calculation. The specific loudness calculation, loudness calculation and reference comparison are repeated until the loudness and the reference loudness value are substantially equivalent. Thus, the gain applied to the frequency banded signals represents the gain which, when applied to the input audio signal results in the perceived loudness of the input audio signal being essentially equivalent to the reference loudness. A single value of the loudness measure may be calculated for some finite range of the input signal, or the loudness measure may be repetitively calculated on time intervals or blocks of the input audio signal. A recursive application of gain is preferred due to the non-linear nature of perceived loudness as well as the structure of the loudness measurement process.

The various aspects of the present invention and its preferred embodiments may be better understood by referring to the following disclosure and the accompanying drawings in which the like reference numerals refer to the like elements in the several figures. The drawings, which illustrate various devices or processes, show major elements that are helpful in understanding the present invention. For the sake of clarity, the drawings omit many other features that may be important in practical embodiments and are well known to those of ordinary skill in the art but are not important to understanding the concepts of the present invention. The signal processing for practicing the present invention may be accomplished in a wide variety of ways including programs executed by microprocessors, digital signal processors, logic arrays and other forms of computing circuitry.

BEST MODES FOR CARRYING OUT THE INVENTION

As described in greater detail below, an embodiment of a first aspect of the present invention, shown in FIG. 1, includes a specific loudness controller or controller function ("Specific Loudness Control") 124 that analyzes and derives characteristics of an input audio signal. The audio characteristics are used to control parameters in a specific loudness converter or converter function ("Specific Loudness") 120. By adjusting the specific loudness parameters using signal characteristics, the objective loudness measurement technique of the present invention may be matched more closely to subjective loudness results produced by statistically measuring loudness using multiple human listeners. The use of signal characteristics to control loudness parameters may also reduce the occurrence of incorrect measurements that result in signal loudness deemed annoying to listeners.

Figure 2:
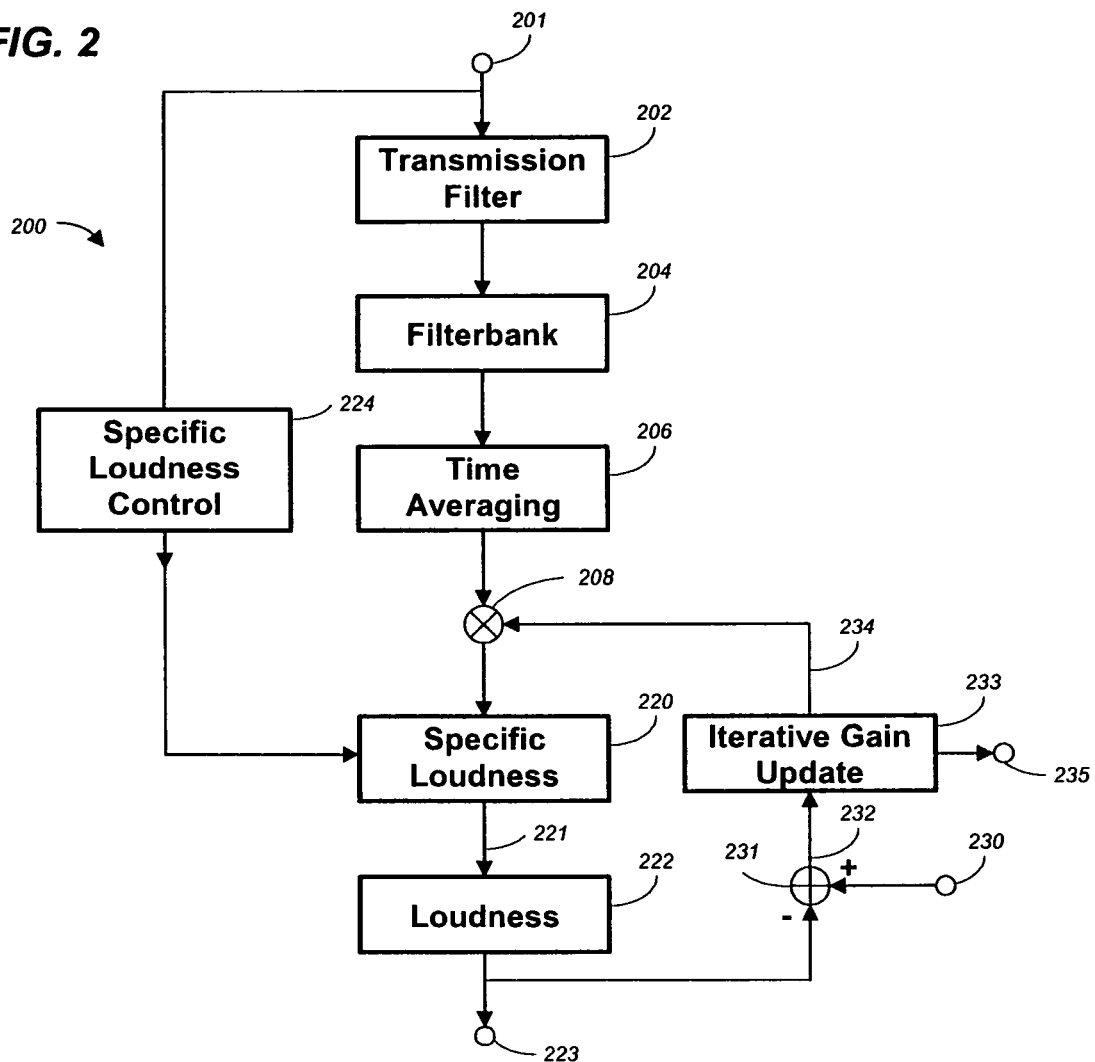
FIG. 2 is a schematic functional block diagram of an embodiment of a further aspect of the present invention.

As described in greater detail below, an embodiment of a second aspect of the present invention, shown in FIG. 2, adds a gain device or function ("Iterative Gain Update") 233, the purpose of which is to adjust iteratively the gain of the time-averaged excitation signal derived from the input audio signal until the associated loudness at 223 in FIG. 2 matches a desired reference loudness at 230 in FIG. 2. Because the objective measurement of perceived loudness involves an inherently non-linear process, an iterative loop may be advantageously employed to determine an appropriate gain to match the loudness of the input audio signal to a desired loudness level. However, an iterative gain loop surrounding an entire loudness measurement system, such that the gain adjustment is applied to the original input audio signal for each loudness iteration, would be expensive to implement due to the temporal integration required to generate an accurate measure of long-term loudness. In general, in such an arrangement, the temporal integration requires recomputation for each change of gain in the iteration. However, as is explained further below, in the aspects of the invention shown in the embodiments of FIG. 2 and also FIGS. 3, and 10-12, the temporal integration may be performed in linear processing paths that precede and/or follow the non-linear process that forms part of the iterative gain loop. Linear processing paths need not form a part of the iteration loop. Thus, for example in the embodiment of FIG. 2, the loudness measurement path from input 201 to a specific loudness converter or converter function ("Specific Loudness") 220, may include the temporal integration in time averaging function ("Time Averaging") 206, and is linear. Consequently, the gain iterations need only be applied to a reduced set of loudness measurement devices or functions and need not include any temporal integration. In the embodiment of FIG. 2 the transmission filter or transmission filter function ("Transmission Filter") 202, the filter bank or filter bank function ("Filterbank") 204, the time averager or time averaging function ("Time Averaging") 206 and the specific loudness controller or specific loudness control function ("Specific Loudness Control") 224 are not part of the iterative loop, permitting iterative gain control to be implemented in efficient and accurate real-time systems.

Referring again to FIG. 1, a functional block diagram of an embodiment of a loudness measurer or loudness measuring process 100 according to a first aspect of the present invention is shown. An audio signal for which a loudness measurement is to be determined is applied to an input 101 of the loudness measurer or loudness measuring process 100. The input is applied to two paths—a first (main) path that calculates specific loudness in each of a plurality of frequency bands that simulate those of the excitation pattern generated along the basilar membrane of the inner ear and a second (side) path having a specific loudness controller that selects the specific loudness functions or models employed in the main path.

In a preferred embodiment, processing of the audio is performed in the digital domain. Accordingly, the audio input signal is denoted by the discrete time sequence x[n] which has been sampled from the audio source at some sampling frequency $f_s$. It is assumed that the sequence x[n] has been appropriately scaled so that the rms power of x[n] in decibels given by $$RMS_{dB} = 10\log_{10}\left(\frac{1}{L}\sum_{n=0}^{L}x^2[n]\right)$$

is equal to the sound pressure level in dB at which the audio is being auditioned by a human listener. In addition, the audio signal is assumed to be monophonic for simplicity of exposition. The embodiment may, however, be adapted to multi-channel audio in a manner described later.

Transmission Filter 102

Figure 4:
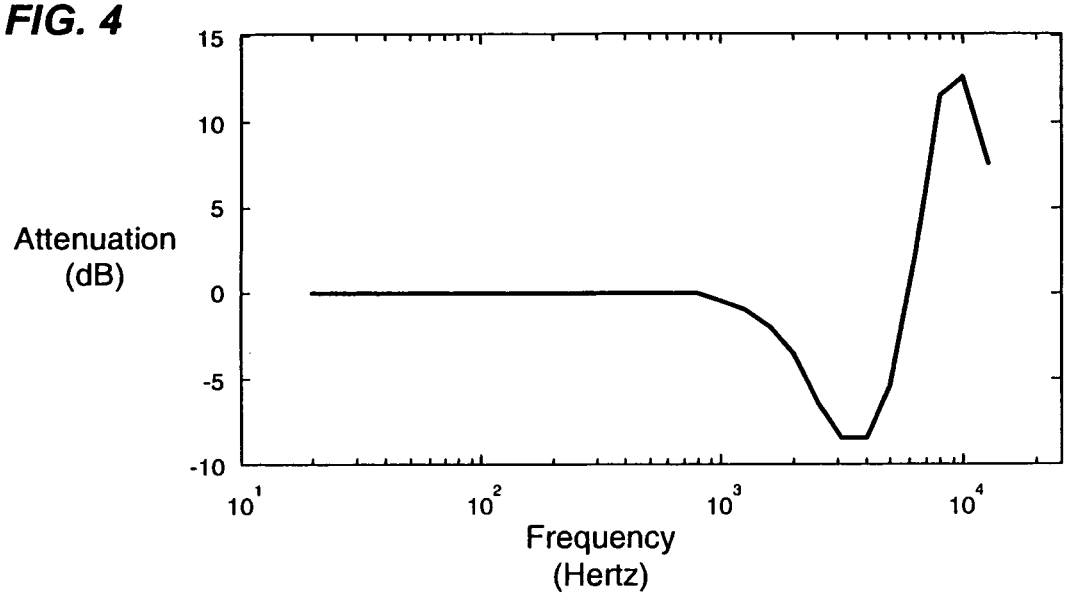
FIG. 4 is an idealized characteristic response of a linear filter P(z) suitable as a transmission filter in an embodiment of the present invention in which the vertical axis is attenuation in decibels (dB) and the horizontal axis is a logarithmic base 10 frequency in Hertz (Hz).

In the main path, the audio input signal is applied to a transmission filter or transmission filter function ("Transmission Filter") 102, the output of which is a filtered version of the audio signal. Transmission Filter 102 simulates the effect of the transmission of audio through the outer and middle ear with the application of a linear filter P(z). As shown in FIG. 4, one suitable magnitude frequency response of P(z) is unity below 1 kHz, and, above 1 kHz, the response follows the inverse of the threshold of hearing as specified in the ISO226 standard, with the threshold normalized to equal unity at 1 kHz. By applying a transmission filter, the audio that is processed by the loudness measurement process more closely resembles the audio that is perceived in human hearing, thereby improving the objective loudness measure. Thus, the output of Transmission Filter 102 is a frequency-dependently scaled version of the time-domain input audio samples x[n].

Filterbank 104

Figure 1:
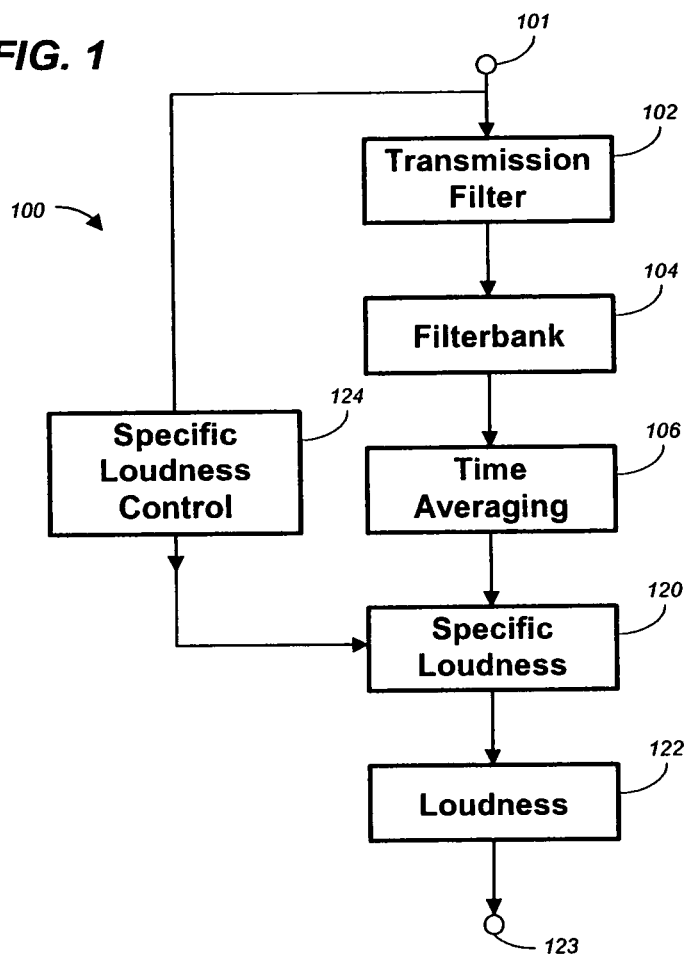
FIG. 1 is a schematic functional block diagram of an embodiment of an aspect of the present invention.

The filtered audio signal is applied to a filterbank or filterbank function ("Filterbank") 104 (FIG. 1). Filterbank 104 is designed to simulate the excitation pattern generated along the basilar membrane of the inner ear. The Filterbank 104 may include a set of linear filters whose bandwidth and spacing are constant on the Equivalent Rectangular Bandwidth (ERB) frequency scale, as defined by Moore, Glasberg and Baer (B. C. J. Moore, B. Glasberg, T. Baer, "A Model for the Prediction of Thresholds, Loudness, and Partial Loudness," supra).

Although the ERB frequency scale more closely matches human perception and shows improved performance in producing objective loudness measurements that match subjective loudness results, the Bark frequency scale may be employed with reduced performance.

For a center frequency f in hertz, the width of one ERB band in hertz may be approximated as:

$$ERB(f)=24.7(4.37f/1000+1) \tag{1}$$

From this relation a warped frequency scale is defined such that at any point along the warped scale, the corresponding ERB in units of the warped scale is equal to one. The function for converting from linear frequency in hertz to this ERB frequency scale is obtained by integrating the reciprocal of Equation 1:

$$HzToERB(f) = \int \frac{1}{24.7(4.37f/1000+1)} df \tag{2a}$$
$$= 21.4\log_{10}(4.37f/1000+1)$$

Figure 5:
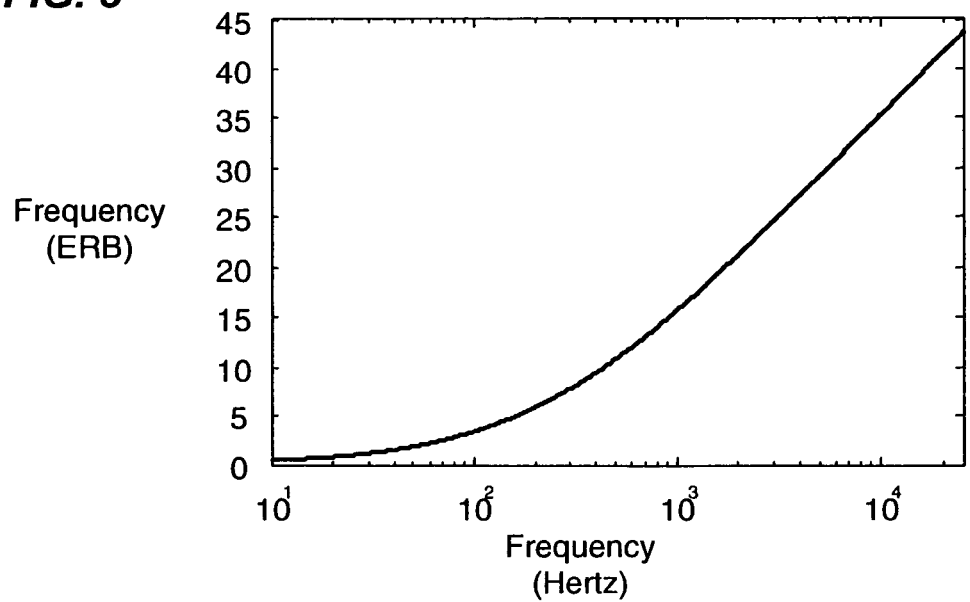
FIG. 5 shows the relationship between the ERB frequency scale (vertical axis) and frequency in Hertz (horizontal axis).

It is also useful to express the transformation from the ERB scale back to the linear frequency scale by solving Equation 2a for f:

$$ERBToHz(e) = f = \frac{1000}{4.37}10^{(e/21.4-1)}, \tag{2b}$$

where e is in units of the ERB scale. FIG. 5 shows the relationship between the ERB scale and frequency in hertz.

The response of the auditory filters for the Filterbank 104 may be characterized and implemented using standard IIR filters. More specifically, the individual auditory filters at center frequency $f_c$ in hertz that are implemented in the Filterbank 104 may be defined by the twelfth order IIR transfer function:

$$H_{f_c}(z) = G\frac{(1-z^{-1})(1-2r_B\cos(2\pi f_B/f_s)z^{-1}+r_B^2 z^{-2})}{(1-2r_A\cos(2\pi f_A/f_s)z^{-1}+r_A z^{-2})^2}, \tag{3}$$

where $$f_A=\sqrt{f_c^2+B_w^2}, \tag{4a}$$

$$r_A=e^{-2\pi B_w/f_s}, \tag{4b}$$

$$B_w=\min\{1.55ERB(f_c), 0.5f_c, \tag{4c}$$

$$f_B=\min\{ERBscale^{-1}(ERBscale(f_c)+5.25), f_s/2\}, \tag{4d}$$

$$r_B=0.985, \tag{4e}$$

$f_s$ is the sampling frequency in hertz, and G is a normalizing factor to ensure that each filter has unity gain at the peak in its frequency response; chosen such that $$\max_\omega\{|H_{f_c}(e^{j\omega})|\} = 1. \tag{4f}$$

Figure 6:
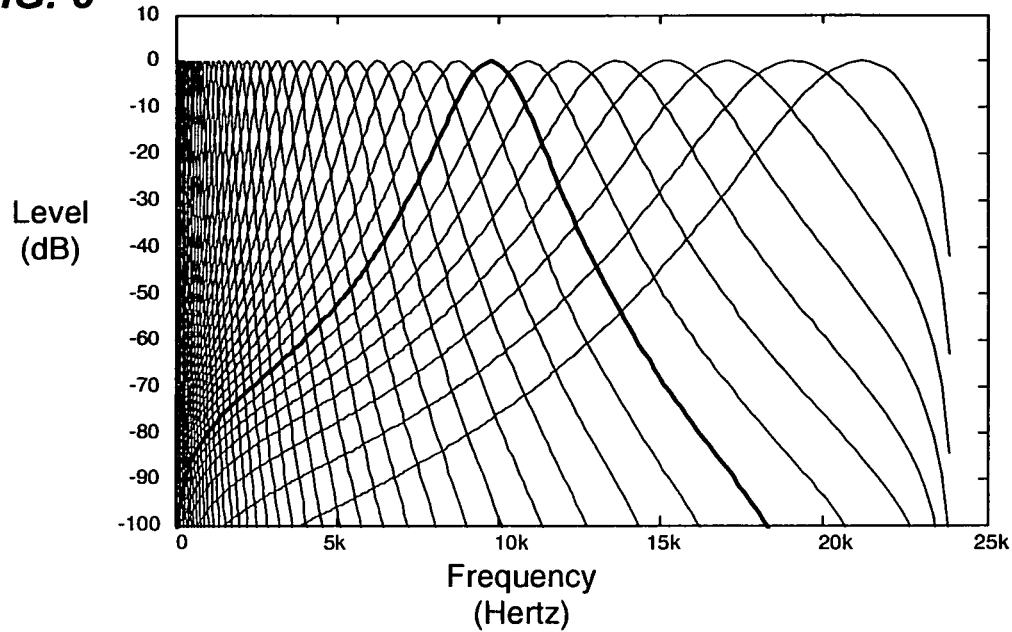
FIG. 6 shows a set idealized auditory filter characteristic responses that approximate critical banding on the ERB scale. The horizontal scale is frequency in Hertz and the vertical scale is level in decibels.

The Filterbank 104 may include M such auditory filters, referred to as bands, at center frequencies $f_c[1] \ldots f_c[M]$ spaced uniformly along the ERB scale. More specifically, $$f_c[1]=f_{min} \tag{5a}$$

$$f_c[m]=f_c[m-1]+ERBToHz(HzToERB(f_c[m-1])+\Delta) \; m=2 \ldots M \tag{5b}$$

$$f_c[M]<f_{max}, \tag{5c}$$

where Δ is the desired ERB spacing of the Filterbank 104, and where $f_{min}$ and $f_{max}$ are the desired minimum and maximum center frequencies, respectively. One may choose Δ=1, and taking into account the frequency range over which the human ear is sensitive, one may set $f_{min}$=50 Hz and $f_{max}$=20,000 Hz. With such parameters, for example, application of Equations 6a-c yields M=40 auditory filters. The magnitudes of such M auditory filters, which approximate critical banding on the ERB scale, are shown in FIG. 6.

Alternatively, the filtering operations may be adequately approximated using a finite length Discrete Fourier Transform, commonly referred to as the Short-Time Discrete Fourier Transform (STDFT), because an implementation running the filters at the sampling rate of the audio signal, referred to as a full-rate implementation, is believed to provide more temporal resolution than is necessary for accurate loudness measurements. By using the STDFT instead of a full-rate implementation, an improvement in efficiency and reduction in computational complexity may be achieved.

The STDFT of input audio signal x[n] is defined as:

$$X[k,t] = \sum_{n=0}^{N-1} w[n]x[n+tT]e^{-j\frac{2\pi k}{N}}, \tag{6}$$

where k is the frequency index, t is the time block index, N is the DFT size, T is the hop size, and w[n] is a length N window normalized so that $$\sum_{n=0}^{N-1} w^2[n] = 1 \tag{7}$$

Note that the variable t in Equation 6 is a discrete index representing the time block of the STDFT as opposed to a measure of time in seconds. Each increment in t represents a hop of T samples along the signal x[n]. Subsequent references to the index t assume this definition. While different parameter settings and window shapes may be used depending upon the details of implementation, for $f_s$=44100 Hz, choosing N=4096, T=2048, and having w[n] be a Hanning window produces excellent results. The STDFT described above may be more efficient using the Fast Fourier Transform (FFT).

In order to compute the loudness of the input audio signal, a measure of the audio signals' energy in each filter of the Filterbank 104 is needed. The short-time energy output of each filter in Filterbank 104 may be approximated through multiplication of filter responses in the frequency domain with the power spectrum of the input signal:

$$E[m, t] = \frac{1}{N} \sum_{k=0}^{N-1} \left| H_{f_{c_m}}\left(e^{j\frac{2\pi k}{N}}\right)\right|^2 \left|P\left(e^{j\frac{2\pi k}{N}}\right)\right|^2 |X[k, t]|^2, \quad (8)$$

where m is the band number, t is the block number, and P is the transmission filter. It should be noted that forms for the magnitude response of the auditory filters other than that specified in Equation 3 may be used in Equation 8 to achieve similar results. For example, Moore and Glasberg propose a filter shape described by an exponential function that performs similarly to Equation 3. In addition, with a slight reduction in performance, one may approximate each filter as a "brick-wall" band pass with a bandwidth of one ERB, and as a further approximation, the transmission filter P may be pulled out of the summation. In this case, Equation 8 simplifies to $$E[m, t] = \frac{1}{N} |P(e^{j2\pi f_c[m]/f_s})|^2 \sum_{k=k_1}^{k_2} |X[k, t]|^2 \quad (9a)$$

$$k_1 = \text{round}(ERBToHz(HzToERB(f_c[m]) - 1/2)N/f_s) \quad (9b)$$

$$k_2 = \text{round}(ERBToHz(HzToERB(f_c[m]) + 1/2)N/f_s) \quad (9c)$$

Thus, the excitation output of Filterbank 104 is a frequency domain representation of energy E in respective ERB bands m per time period t.

Multi-Channel

For the case when the input audio signal is of a multi-channel format to be auditioned over multiple loudspeakers, one for each channel, the excitation for each individual channel may first be computed as described above. In order to subsequently compute the perceived loudness of all channels combined, the individual excitations may be summed together into a single excitation to approximate the excitation reaching the ears of a listener. All subsequent processing is then performed on this single, summed excitation.

Time Averaging 106

Research in psychoacoustics and subjective loudness tests suggest that when comparing the loudness between various audio signals listeners perform some type of temporal integration of short-term or "instantaneous" signal loudness to arrive at a value of long-term perceived loudness for use in the comparison. When building a model of loudness perception, others have suggested that this temporal integration be performed after the excitation has been transformed non-linearly into specific loudness. However, the present inventors have determined that this temporal integration may be adequately modeled using linear smoothing on the excitation before it is transformed into specific loudness. By performing the smoothing prior to computation of specific loudness, according to an aspect of the present invention, a significant advantage is realized when computing the gain that needs to be applied to a signal in order to adjust its measured loudness in a prescribed manner. As explained further below, the gain may be calculated by using an iterative loop that not only excludes the excitation calculation but preferably excludes such temporal integration. In this manner, the iteration loop may generate the gain through computations that depend only on the current time frame for which the gain is being computed as opposed to computations that depend on the entire time interval of temporal integration. The result is a savings in both processing time and memory. Embodiments that calculate a gain using an iterative loop include those described below in connection with FIGS. 2, 3, and 10-12.

Returning to the description of FIG. 1, linear smoothing of the excitation may be implemented in various ways. For example, smoothing may be performed recursively using a time averaging device or function ("Time Averaging") 106 employing the following equations:

$$\tilde{E}[m, t] = \tilde{E}[m, t-1] + \frac{1}{\tilde{\sigma}[m, t]}(E[m, t] - \tilde{E}[m, t-1]) \quad (10a)$$

$$\tilde{\sigma}[m, t] = \lambda_m \tilde{\sigma}[m, t-1] + 1, \quad (10b)$$

where the initial conditions are $\tilde{E}[m,-1]=0$ and $\tilde{\sigma}[m,-1]=0$. A unique feature of the smoothing filter is that by varying the smoothing parameter $\lambda_m$, the smoothed energy $\tilde{E}[m,t]$ may vary from the true time average of $E[m,t]$ to a fading memory average of $E[m,t]$. If $\lambda_m=1$ then from (10b) it may be seen that $\tilde{\sigma}[m,t]=t$, and $\tilde{E}[m,t]$ is then equal to the true time average of $E[m,t]$ for time blocks 0 up to t. If $0 \leq \lambda_m < 1$ then $\tilde{\sigma}[m,t] \rightarrow 1/(1-\lambda_m)$ as $t \rightarrow \infty$ and $\tilde{E}[m,t]$ is simply the result of applying a one pole smoother to $E[m,t]$. For the application where a single number describing the long-term loudness of a finite length audio segment is desired, one may set $\lambda_m=1$ for all m. For a real-time application where one would like to track the time-varying long-term loudness of a continuous audio stream in real-time, one may set $0 \leq \lambda_m < 1$ and set $\lambda_m$ to the same value for all m.

In computing the time-average of $E[m,t]$, it may be desirable to omit short-time segments that are considered "too quiet" and do not contribute to the perceived loudness. To achieve this, a second thresholded smoother may be run in parallel with the smoother in Equation 10. This second smoother holds its current value if $E[m,t]$ is small relative to $\tilde{E}[m,t]$:

$$\bar{E}[m, t] = \begin{cases} \bar{E}[m, t-1] + \frac{1}{\tilde{\sigma}[m, t]}(E[m, t] - \bar{E}[m, t-1]), & \sum_{m=1}^{M} E[m, t] > 10^{\frac{tdB}{10}} \sum_{m=1}^{M} \tilde{E}[m, t] \\ \bar{E}[m, t-1], & \text{otherwise} \end{cases} \quad (11a)$$

$$\bar{\sigma}[m,t] = \begin{cases} \lambda_m \bar{\sigma}[m,t-1]+1, & \sum_{m=1}^{M} E[m,t] > 10^{\frac{tdB}{10}} \sum_{m=1}^{M} \tilde{E}[m,t], \\ \bar{\sigma}[m,t-1], & \text{otherwise} \end{cases}$$ (11b)

where tdB is the relative threshold specified in decibels. Although it is not critical to the invention, a value of tdB=−24 has been found to produce good results. If there is no second smoother running in parallel, then $\bar{E}[m,t]=\tilde{E}[m,t]$.

Specific Loudness 120

It remains for the banded time-averaged excitation energy $\bar{E}[m,t]$ to be converted into a single measure of loudness in perceptual units, sone in this case. In the specific loudness converter or conversion function ("Specific Loudness") 120, each band of the excitation is converted into a value of specific loudness, which is measured in sone per ERB. In the loudness combiner or loudness combining function ("Loudness") 122, the values of specific loudness may be integrated or summed across bands to produce the total perceptual loudness.

Specific Loudness Control 124/Specific Loudness 120 Multiple Models

In one aspect, the present invention utilizes a plurality of models in block 120 for converting banded excitation to banded specific loudness. Control information derived from the input audio signal via Specific Loudness Control 124 in the side path selects a model or controls the degree to which a model contributes to the specific loudness. In block 124, certain features or characteristics that are useful for selecting one or more specific loudness models from those available are extracted from the audio. Control signals that indicate which model, or combinations of models, should be used are generated from the extracted features or characteristics. Where it may be desirable to use more than one model, the control information may also indicate how such models should be combined.

For example, the per band specific loudness N'[m,t] may be expressed as a linear combination of the per band specific loudness for each model $N_q'[m,t]$ as:

$$N'[m,t] = \sum_{q=1}^{Q} \alpha_q[m,t] N_q'[m,t],$$ (12)

where Q indicates the total number of models and the control information $\alpha_q[m,t]$ represents the weighting or contribution of each model. The sum of the weightings may or may not equal one, depending on the models being used.

Although the invention is not limited to them, two models have been found to give accurate results. One model performs best when the audio signal is characterized as narrowband, and the other performs best when the audio signal is characterized as wideband.

Figure 7:
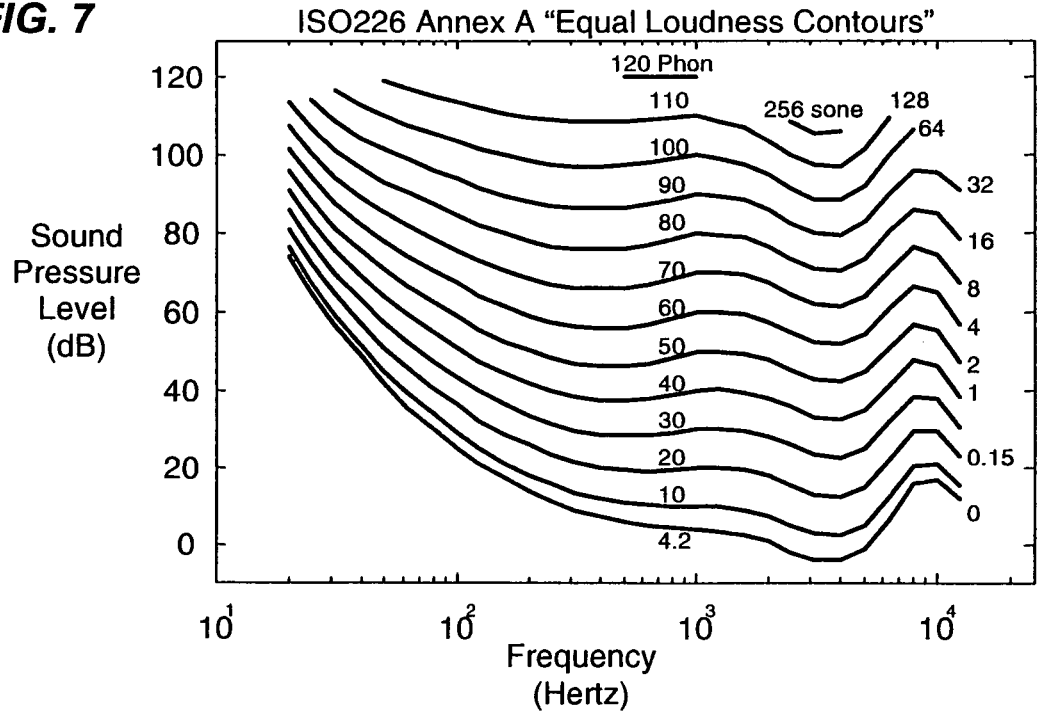
FIG. 7 shows the equal loudness contours of ISO266. The horizontal scale is frequency in Hertz (logarithmic base 10 scale) and the vertical scale is sound pressure level in decibels.
Figure 8:
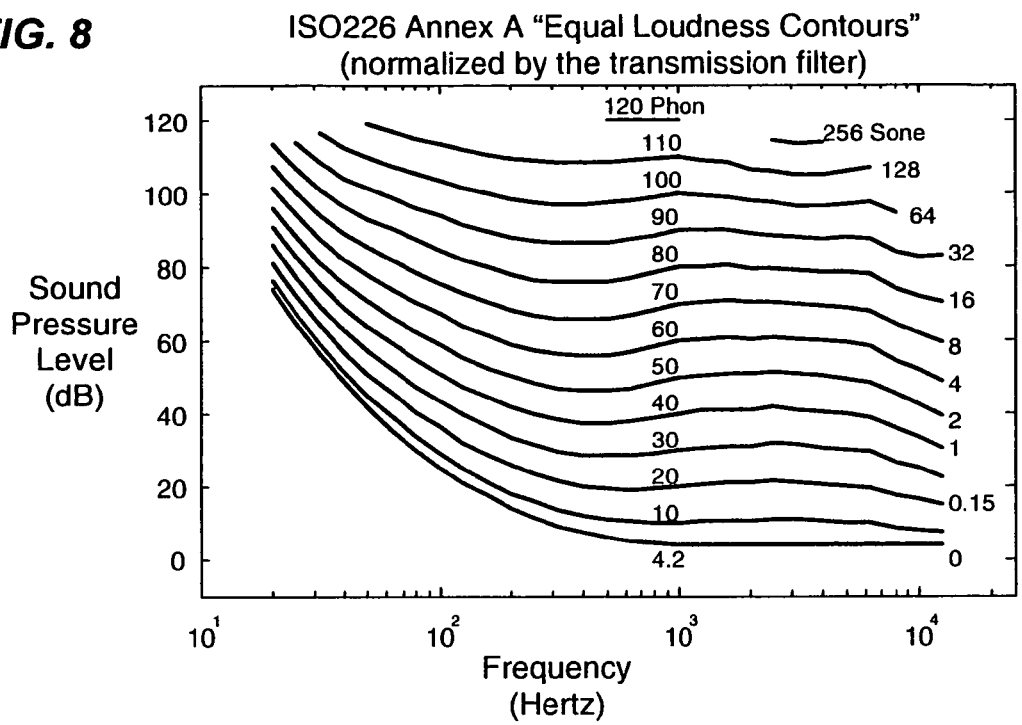
FIG. 8 shows the equal loudness contours of ISO266 normalized by the transmission filter P(z). The horizontal scale is frequency in Hertz (logarithmic base 10 scale) and the vertical scale is sound pressure level in decibels.

Initially, in computing specific loudness, the excitation level in each band of $\bar{E}[m,t]$ may be transformed to an equivalent excitation level at 1 kHz as specified by the equal loudness contours of ISO266 (FIG. 7) normalized by the transmission filter P(z) (FIG. 8):

$$\bar{E}_{1kHz}[m,t] = L_{1kHz}(\bar{E}[m,t], f_c[m]),$$ (13)

where $L_{1kHz}(E,f)$ is a function that generates the level at 1 kHz, which is equally loud to level E at frequency f. In practice, $L_{1kHz}(E,f)$ is implemented as an interpolation of a look-up table of the equal loudness contours, normalized by the transmission filter. Transformation to equivalent levels at 1 kHz simplifies the following specific loudness calculation.

Next, the specific loudness in each band may be computed as:

$$N'[m,t]=\alpha[m,t]N'_{NM}[m,t]+(1-\alpha[m,t])N'_{WB}[m,t],$$ (14)

where $N_{NB}'[m,t]$ and $N_{WB}'[m,t]$ are specific loudness values based on a narrowband and wideband signal model, respectively. The value $\alpha[m,t]$ is an interpolation factor lying between 0 and 1 that is computed from the audio signal, the details of which are described below.

The narrowband and wideband specific loudness values $N_{NB}'[m,t]$ and $N_{WB}'[m,t]$ may be estimated from the banded excitation using the exponential functions:

$$N'_{NB}[m,t] = \begin{cases} G_{NB}\left(\left(\frac{\bar{E}_{1kHz}[m,t]}{TQ_{1kHz}}\right)^{\beta_{NB}}-1\right), & \bar{E}_{1kHz}[m,t]>10^{\frac{TQ_{1kHz}}{10}} \\ 0, & \text{otherwise} \end{cases}$$ (15a)

$$N'_{WB}[m,t] =$$ (15b)
$$\begin{cases} G_{WB}\left(\left(\frac{\bar{E}_{1kHz}[m,t]}{TQ_{1kHz}}\right)^{\beta_{WB}}-1\right), & \bar{E}_{1kHz}[m,t]>10^{\frac{TQ_{1kHz}}{10}}, \\ 0, & \text{otherwise} \end{cases}$$

where $TQ_{1kHz}$ is the excitation level at threshold in quiet for a 1 kHz tone. From the equal loudness contours (FIGS. 7 and 8) $TQ_{1kHz}$ equals 4.2 dB. One notes that both of these specific loudness functions are equal to zero when the excitation is equal to the threshold in quiet. For excitations greater than the threshold in quiet, both functions grow monotonically with a power law in accordance with Stevens' law of intensity sensation. The exponent for the narrowband function is chosen to be larger than that of the wideband function, making the narrowband function increase more rapidly than the wideband function. The specific selection of exponents β and gains G for the narrowband and wideband cases and are discussed below.

Loudness 122

Loudness 122 uses the banded specific loudness of Specific Loudness 120 to create a single loudness measure for the audio signal, namely an output at terminal 123 that is a loudness value in perceptual units. The loudness measure may have arbitrary units, as long the comparison of loudness values for different audio signals indicates which is louder and which is softer.

The total loudness expressed in units of sone may be computed as the sum of the specific loudness for all frequency bands:

$$S[t] = \Delta \sum_{m=1}^{M} N'[m, t], \tag{16}$$

where $\Delta$ is the ERB spacing specified in Equation 6b. The parameters $G_{NB}$ and $\beta_{NB}$ in Equation 15a are chosen so that when $\alpha[m,t]=1$, a plot of S in sone versus SPL for a 1 kHz tone substantially matches the corresponding experimental data presented by Zwicker (the circles in FIG. 9) (Zwicker, H. Fastl, "Psychoacoustics—Facts and Models," supra). The parameters $G_{WB}$ and $\beta_{WB}$ in Equation 15b are chosen so that when $\alpha[m,t]=0$, a plot of N in sone versus SPL for uniform exciting noise (noise with equal power in each ERB) substantially matches the corresponding results from Zwicker (the squares in FIG. 9). A least squares fit to Zwicker's data yields:

$G_{NB}$=0.0404 (17a)

$\beta_{NB}$=0.279 (17b)

$G_{WB}$=0.058 (17c)

$\beta_{NB}$=0.212 (17d)

Figure 9:
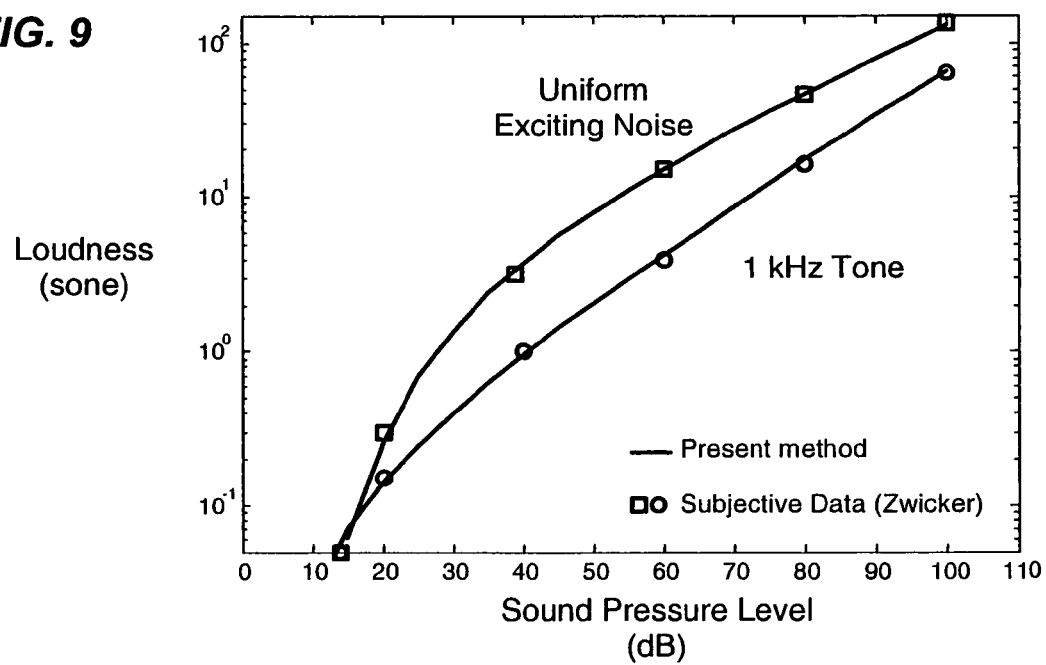
FIG. 9 (solid lines) shows plots of loudness for both uniform-exciting noise and a 1 kHz tone in which solid lines are in accordance with an embodiment of the present invention in which parameters are chosen to match experimental data according to Zwicker (squares and circles). The vertical scale is loudness in sone (logarithmic base 10) and the horizontal scale is sound pressure level in decibels.

FIG. 9 (solid lines) shows plots of loudness for both uniform-exciting noise and a 1 kHz tone.

Specific Loudness Control 124

As previously mentioned, two models of specific loudness are used in a practical embodiment (Equations 15a and 15b), one for narrowband and one for wideband signals. Specific Loudness Control 124 in the side path calculates a measure, $\alpha[m,t]$, of the degree to which the input signal is either narrowband or wideband in each band. In a general sense, $\alpha[m,t]$ should equal one when the signal is narrowband near the center frequency $f_c[m]$ of a band and zero when the signal is wideband near the center frequency $f_c[m]$ of a band. The control should vary continuously between the two extremes for varying mixtures of such features. As a simplification, the control $\alpha[m,t]$ may be chosen as constant across the bands, in which case $\alpha[m, t]$ is subsequently referred to as $\alpha[t]$, omitting the band index m. The control $\alpha[t]$ then represents a measure of how narrowband the signal is across all bands. Although a suitable method for generating such a control is described next, the particular method is not critical and other suitable methods may be employed.

The control $\alpha[t]$ may be computed from the excitation $E[m,t]$ at the output of Filterbank 104 rather than through some other processing of the signal x[n]. $E[m,t]$ may provide an adequate reference from which the "narrowbandedness" and "widebandedness" of x[n] is measured, and as a result, $\alpha[t]$ may be generated with little added computation.

"Spectral flatness" is a feature of $E[m,t]$ from which $\alpha[t]$ may be computed. Spectral flatness, as defined by Jayant and Noll (N. S. Jayant, P. Noll, *Digital Coding Of Waveforms*, Prentice Hall, New Jersey, 1984), is the ratio of the geometric mean to the arithmetic mean, where the mean is taken across frequency (index m in the case of $E[m,t]$). When $E[m,t]$ is constant across m, the geometric mean is equal to the arithmetic mean, and the spectral flatness equals one. This corresponds to the wideband case. If $E[m,t]$ varies significantly across m, then the geometric mean is significantly smaller than the arithmetic mean, and the spectral flatness approaches zero. This corresponds to the narrowband case. By computing one minus the spectral flatness, one may generate a measure of "narrowbandedness," where zero corresponds to wideband and one to narrowband. Specifically, one may compute one minus a modified spectral flatness of $E[m,t]$:

$$NB[t] = 1 - \frac{\left( \prod_{m=M_l[t]}^{M_u[t]} \frac{E[m,t]}{|P[m]|^2} \right)^{\frac{1}{M_u[t]-M_l[t]+1}}}{\frac{1}{M_u[t]-M_l[t]+1} \sum_{m=m_l[t]}^{M_u[t]} \frac{E[m,t]}{|P[m]|^2}}, \tag{18}$$

where P[m] is equal to the frequency response of the transmission filter P(z) sampled at frequency $\omega=2\pi f_c[m]/f_s$. Normalization of $E[m,t]$ by the transmission filter may provide better results because application of the transmission filter introduces a "bump" in $E[m,t]$ that tends to inflate the "narrowbandedness" measure. Additionally, computing the spectral flatness over a subset of the bands of $E[m,t]$ may yield better results. The lower and upper limits of summation in Equation 18, $M_l[t]$ and $M_u[t]$, define a region that may be smaller than the range of all M bands. It is desired that $M_l[t]$ and $M_u[t]$ include the portion of $E[m,t]$ that contains the majority of its energy, and that the range defined by $M_l[t]$ and $M_u[t]$ be no more than 24 units wide on the ERB scale. More specifically (and recalling that $f_c[m]$ is the center frequency of band m in Hz), one desires:

$HzToERB(f_c[M_u[t]])-HzToERB(f_c[M_l[t]]) \approx 24$ (19a)

and one requires:

$HzToERB(f_c[M_u[t]]) \geq CT[t] \geq HzToERB(f_c[M_l[t]])$ (19b)

$HzToERB(f_c[M_l[t]]) \leq HzToERB(f_c[1])$ (19c)

$HzToERB(f_c[M_u[t]]) \leq HzToERB(f_c[M])$, (19d)

where CT[t] is the spectral centroid of $E[m,t]$ measured on the ERB scale:

$$CT[t] = \frac{\sum_{m=1}^{M} HzToERB(f_c[m])E[m,t]}{\sum_{m=1}^{M} E[m,t]}, \tag{19e}$$

Ideally, the limits of summation, $M_l[t]$ and $M_u[t]$, are centered around CT[t] when measured on the ERB scale, but this is not always possible when CT[t] is near the lower or upper limits of its range.

Next, NB[t] may be smoothed over time in a manner analogous to Equation 11a:

$$\overline{NB}[t] = \begin{cases} \overline{NB}[t-1] + \frac{1}{\bar{\sigma}[t]}(NB[t] - \overline{NB}[t-1]), & \sum_{m=1}^{M} E[m,t] > 10^{\frac{tdB}{10}} \sum_{m=1}^{M} \tilde{E}[m,t], \\ \overline{NB}[t-1], & \text{otherwise} \end{cases} \tag{20}$$

where $\bar{\sigma}[t]$ is equal to the maximum of $\bar{\sigma}[m,t]$, defined in Equation 11b, over all m. Lastly, $\alpha[t]$ is computed from $\overline{NB}[t]$ as follows:

$$\alpha[t] = \begin{cases} 0, & \Phi\{\overline{NB}[t]\} < 0 \\ \Phi\{\overline{NB}[t]\}, & 0 \le \Phi\{\overline{NB}[t]\} \le 1, \\ 1, & \Phi\{\overline{NB}[t]\} \ge 1 \end{cases} \quad (21a)$$

where $$\Phi\{x\} = 12.2568x^3 - 22.8320x^2 + 14.5869x - 2.9594 \quad (21b)$$

Although the exact form of $\Phi\{X\}$ is not critical, the polynomial in Equation 21b may be found by optimizing $\alpha[t]$ against the subjectively measured loudness of a large variety of audio material.

FIG. 2 shows a functional block diagram of an embodiment of a loudness measurer or loudness measuring process 200 according to a second aspect of the present invention. Devices or functions 202, 204, 206, 220, 222, 223 and 224 of FIG. 2 correspond to the respective devices or functions 102, 104, 106, 120, 122, 123 and 124 of FIG. 1.

According to the first aspect of the invention, of which FIG. 1 shows an embodiment, the loudness measurer or computation generates a loudness value in perceptual units. In order to adjust the loudness of the input signal, a useful measure is a gain G[t], which when multiplied with the input signal x[n] (as, for example, in the embodiment of FIG. 3, described below), makes its loudness equal to a reference loudness level $S_{ref}$. The reference loudness, $s_{ref}$, may be specified arbitrarily or measured by another device or process operating in accordance with the first aspect of the invention from some "known" reference audio signal. Letting $\Psi\{x[n],t\}$ represent all the computation performed on signal x[n] to generate loudness S[t], one wants to find G[t] such that $$S_{ref} = S[t] = \Psi\{G[t]x[n],t\} \quad (23)$$

Because a portion of the processing embodied in $\Psi\{\bullet\}$ is non-linear, no closed form solution for G[t] exists, so instead an iterative technique may be utilized to find an approximate solution. At each iteration i in the process, let $G_i$ represent the current estimate of G[t]. For every iteration, $G_i$ is updated so that the absolute error from the reference loudness decreases:

$$|S_{ref} - \Psi\{G_i x[n],t\}| < |S_{ref} - \Psi\{G_{i-1} x[n],t\}| \quad (24)$$

There exist many suitable techniques for updating Go in order to achieve the above decrease in error. One such method is gradient descent (see *Nonlinear Programming* by Dimitri P. Bertseakas, Athena Scientific, Belmont, Mass. 1995) in which $G_i$ is updated by an amount proportional to the error at the previous iteration:

$$G_i = G_{i-1} + \mu(S_{ref} - \Psi\{G_{i-1}x[n],t\}), \quad (25)$$

where $\mu$ is the step size of the iteration. The above iteration continues until the absolute error is below some threshold, until the number of iterations has reached some predefined maximum limit, or until a specified time has passed. At that point G[t] is set equal to $G_i$.

Referring back to Equations 6-8, one notes that the excitation of the signal x[n] is obtained through linear operations on the square of the signal's STDFT magnitude, $|X[k,t]|^2$. It follows that the excitation resulting from a gain-modified signal Gx[n] is equal to the excitation of x[n] multiplied by $G^2$. Furthermore, the temporal integration required to estimate long-term perceived loudness may be performed through linear time-averaging of the excitation, and therefore the time-averaged excitation corresponding to Gx[n] is equal to the time-averaged excitation of x[n] multiplied by $G^2$. As a result, the time averaging need not be recomputed over the entire input signal history for every reevaluation of $\Psi\{G_i x[n],t\}$ in the iterative process described above. Instead, the time-averaged excitation $\bar{E}[m,t]$ may be computed only once from x[n], and, in the iteration, updated values of loudness may be computed by applying the square of the updated gain directly to $\bar{E}[m,t]$. Specifically, letting $\Psi_E\{\bar{E}[m,t]\}$ represent all the processing performed on the time averaged excitation $\bar{E}[m,t]$ to generate S[t], the following relationship holds for a general multiplicative gain G:

$$\Psi_E\{G^2 \bar{E}[m,t]\} = \Psi\{Gx[n],t\} \quad (26)$$

Using this relationship, the iterative process may be simplified by replacing $\Psi\{G_i x[n],t\}$ with $\Psi_E\{G_i^2 \bar{E}[m,t]\}$. This simplification would not be possible had the temporal integration required to estimate long-term perceived loudness been performed after the non-linear transformation to specific loudness.

The iterative process for computing G[t] is depicted in FIG. 2. The output loudness S[t] at terminal 223 may be subtracted in a subtractive combiner or combining function 231 from reference loudness $S_{ref}$ at terminal 230. The resulting error signal 232 is fed into an iterative gain updater or updating function ("Iterative Gain Update") 233 that generates the next gain $G_i$ in the iteration. The square of this gain, $G_i^2$, is then fed back at output 234 to multiplicative combiner 208 where $G_i^2$ is multiplied with the time-averaged excitation signal from block 206. The next value of S[t] in the iteration is then computed from this gain-modified version of the time-averaged excitation through blocks 220 and 222. The described loop iterates until the termination conditions are met at which time the gain G[t] at terminal 235 is set equal to the current value of $G_i$. The final value G[t] may be computed through the described iterative process, for example, for every FFT frame t or just once at the end of an audio segment after the excitation has been averaged over the entire length of this segment.

If one wishes to compute the non-gain-modified signal loudness in conjunction with this iterative process, the gain $G_i$ can be initialize to one at the beginning of each iterative process for each time period t. This way, the first value of S[t] computed in the loop represents the original signal loudness and can be recorded as such. If one does not wish to record this value, however, $G_i$ may be initialized with any value. In the case when G[t] is computed over consecutive time frames and one does not wish to record the original signal loudness, it may be desirable to initialize $G_i$ equal to the value of G[t] from the previous time period. This way, if the signal has not changed significantly from the previous time period, it likely that the value G[t] will have remained substantially the same. Therefore, only a few iterations will be required to converge to the proper value.

Figure 3:
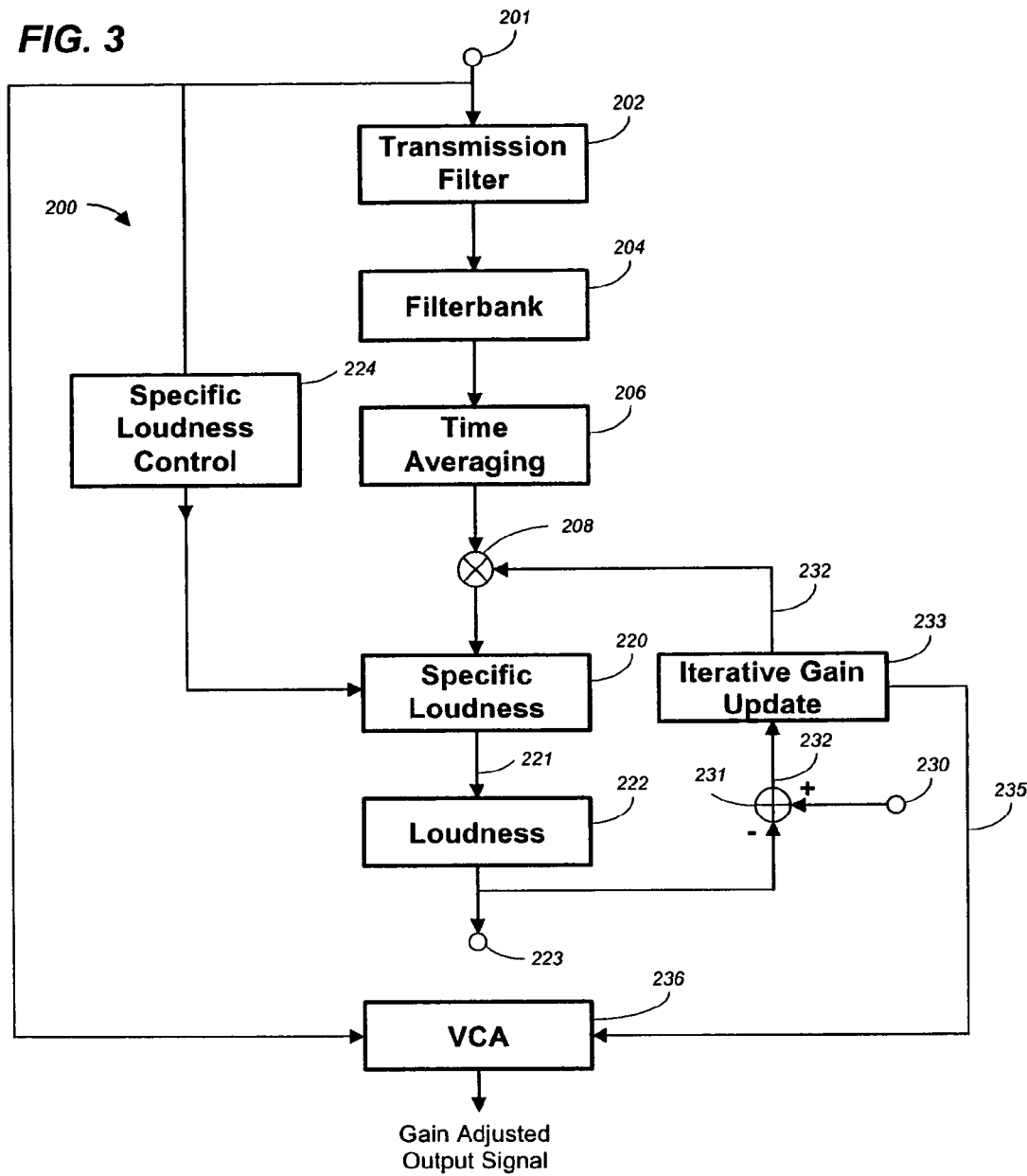
FIG. 3 is a schematic functional block diagram of an embodiment of yet a further aspect of the present invention.

Once the iterations are complete, G[t] represents the gain to be applied to the input audio signal at 201 by some external device such that the loudness of the modified signal matches the reference loudness. FIG. 3 shows one suitable arrangement in which the gain G[t] from the Iterative Gain Update 233 is applied to a control input of a signal level controlling device or function such as a voltage controlled amplifier (VCA) 236 in order to provide a gain adjusted output signal. VCA 234 in FIG. 3 may be replaced by a human operator controlling a gain adjuster in response to a sensory indication of the gain G[t] on line 235. A sensory indication may be provided by a meter, for example. The gain G[t] may be subject to time smoothing (not shown).

For some signals, an alternative to the smoothing described in Equations 10 and 11 may be desirable for computing the long-term perceived loudness. Listeners tend to associate the long-term loudness of a signal with the loudest portions of that signal. As a result, the smoothing presented in Equations 10 and 11 may underestimate the perceived loudness of a signal containing long periods of relative silence interrupted by shorter segments of louder material. Such signals are often found in film sound tracks with short segments of dialog surrounded by longer periods of ambient scene noise. Even with the thresholding presented in Equation 11, the quiet portions of such signals may contribute too heavily to the time-averaged excitation $\bar{E}[m,t]$.

To deal with this problem, a statistical technique for computing the long-term loudness may be employed in a further aspect of the present invention. First, the smoothing time constant in Equations 10 and 11 is made very small and tdB is set to minus infinity so that $\bar{E}[m,t]$ represents the "instantaneous" excitation. In this case, the smoothing parameter $\lambda_m$ may be chosen to vary across the bands m to more accurately model the manner in which perception of instantaneous loudness varies across frequency. In practice, however, choosing $\lambda_m$ to be constant across m still yields acceptable results. The remainder of the previously described algorithm operates unchanged resulting in an instantaneous loudness signal S[t], as specified in Equation 16. Over some range $t_1 \leq t \leq t_2$ the long-term loudness $S_p[t_1,t_2]$ is then defined as a value which is greater than S[t] for p percent of the time values in the range and less than S[t] for 100-p percent of the time values in the range. Experiments have shown that setting p equal to roughly 90% matches subjectively perceived long-term loudness. With this setting, only 10% of the values of S[t] need be significant to affect the long-term loudness. The other 90% of the values can be relatively silent without lowering the long-term loudness measure.

The value $S_p[t_1,t_2]$ can be computed by sorting in ascending order the values S[t], $t_1 \leq t \leq t_2$, into a list $S_{sort}\{i\}$, $0 \leq i \leq t_2 - t_1$, where i represents the ith element of the sorted list. The long-term loudness is then given by the element that is p percent of the way into the list:

$$S_p[t_1,t_2] = S_{sort}\{\text{round}(p(t_2-t_1)/100)\} \quad (27)$$

By itself the above computation is relatively straightforward. However, if one wishes to compute a gain $G_p[t_1,t_2]$ which when multiplied with x[n] results in $S_p[t_1,t_2]$ being equal to some reference loudness $S_{ref}$, the computation becomes significantly more complex. As before, an iterative approach is required, but now the long-term loudness measure $S_p[t_1,t_2]$ is dependent on the entire range of values S[t], $t_1 \leq t \leq t_2$, each of which must be updated with each update of $G_i$ in the iteration. In order to compute these updates, the signal $\bar{E}[m,t]$ must be stored over the entire range $t_1 \leq t \leq t_2$. In addition, since the dependence of S[t] on $G_i$ is non-linear, the relative ordering of S[t], $t_1 \leq t \leq t_2$, may change with each iteration, and therefore $S_{sort}\{i\}$ must also be recomputed. The need for re-sorting is readily evident when considering short-time signal segments whose spectrum is just below the threshold of hearing for a particular gain in the iteration. When the gain is increased, a significant portion of the segment's spectrum may become audible, which may make the total loudness of the segment greater than other narrowband segments of the signal which were previously audible. When the range $t_1 \leq t \leq t_2$ becomes large or if one desires to compute the gain $G_p[t_1,t_2]$ continuously as a function of a sliding time window, the computational and memory costs of this iterative process may become prohibitive.

A significant savings in computation and memory is achieved by realizing that S[t] is a monotonically increasing function of $G_i$. In other words, increasing $G_i$ always increases the short-term loudness at each time instant. With this knowledge, the desired matching gain $G_p[t_1,t_2]$ can be efficiently computed as follows. First, compute the previously defined matching gain G[t] from $\bar{E}[m,t]$ using the described iteration for all values of t in the range $t_1 \leq t \leq t_2$. Note that for each value t, G[t] is computed by iterating on the single value $\bar{E}[m,t]$. Next, the long term matching gain $G_p[t_1,t_2]$ is computed by sorting into ascending order the values G[t], $t_1 \leq t \leq t_2$, into a list $G_{sort}\{i\}$, $0 \leq i \leq t_2 - t_1$, and then setting $$G_p[t_1,t_2] = G_{sort}\{\text{round}((100-P)(t_2-t_1)/100)\}. \quad (28)$$

We now argue that $G_p[t_1,t_2]$ is equal to the gain which when multiplied with x[n] results in $S_p[t_1,t_2]$ being equal to the desired reference loudness $S_{ref}$. Note from Equation 28 that $G[t]<G_p[t_1,t_2]$ for 100-p percent of the time values in the range $t_1 \leq t \leq t_2$ and that $G[t]>G_p[t_1,t_2]$ for the other p percent. For those values of G[t] such that $G[t]<G_p[t_1,t_2]$, one notes that if $G_p[t_1,t_2]$ were to be applied to the corresponding values of $\bar{E}[m,t]$ rather than G[t], then the resulting values of S[t] would be greater than the desired reference loudness. This is true because S[t] is a monotonically increasing function of the gain. Similarly, if $G_p[t_1,t_2]$ were to be applied to the values of [m,t] corresponding to G[t] such that $G[t]>G_p[t_1,t_2]$, the resulting values of S[t] would be less than the desired reference loudness. Therefore, application of $G_p[t_1,t_2]$ to all values of $\bar{E}[m,t]$ in the range $t_1 \leq t \leq t_2$ results in s[t] being greater than the desired reference 100-p percent of the time and less than the reference p percent of the time. In other words, $S_p[t_1,t_2]$ equals the desired reference.

This alternate method of computing the matching gain obviates the need to store $\bar{E}[m,t]$ and S[t] over the range $t_1 \leq t \leq t_2$. Only G[t] need be stored. In addition, for every value of $G_p[t_1,t_2]$ that is computed, the sorting of G[t] over the range $t_1 \leq t \leq t_2$ need only be performed once, as opposed to the previous approach where S[t] needs to be re-sorted with every iteration. In the case where $G_p[t_1,t_2]$ is to be computed continuously over some length T sliding window (i.e., $t_1=t-T$, $t_2=t$), the list $G_{sort}\{i\}$ can be maintained efficiently by simply removing and adding a single value from the sorted list for each new time instance. When the range $t_1 \leq t \leq t_2$ becomes extremely large (the length of entire song or film, for example), the memory required to store G[t] may still be prohibitive. In this case, $G_p[t_1,t_2]$ may be approximated from a discretized histogram of G[t]. In practice, this histogram is created from G[t] in units of decibels. The histogram may be computed as H[i]=number of samples in the range $t_1 \leq t \leq t_2$ such that $$\Delta_{dB}i + dB_{min} \leq 20\log_{10}G[t] < \Delta_{dB}(i+1) + dB_{min} \quad (29)$$

where $\Delta dB$ is the histogram resolution and $dB_{min}$ is the histogram minimum. The matching gain is then approximated as $$G_p[t_1, t_2] \cong \Delta_{dB} i_p + dB_{min} \quad (30a)$$

where $$100 \frac{\sum_{i=0}^{i_p} H[i]}{\sum_{i=0}^{l} H[i]} \cong p. \quad (30b)$$

and I is the maximum histogram index. Using the discretized histogram, only I values need be stored, and $G_p[t_1,t_2]$ is easily updated with each new value of G[t].

Other methods for approximating $G_p[t_1,t_2]$ from G[t] may be conceived, and this invention is intended to include such techniques. The key aspect of this portion of the invention is to perform some type of smoothing on the matching gain G[t] to generate the long term matching gain $G_p[t_1,t_2]$ rather than processing the instantaneous loudness S[t] to generate the long term loudness $S_p[t_1,t_2]$ from which $G_p[t_1,t_2]$ is then estimated through an iterative process.

Figure 10:
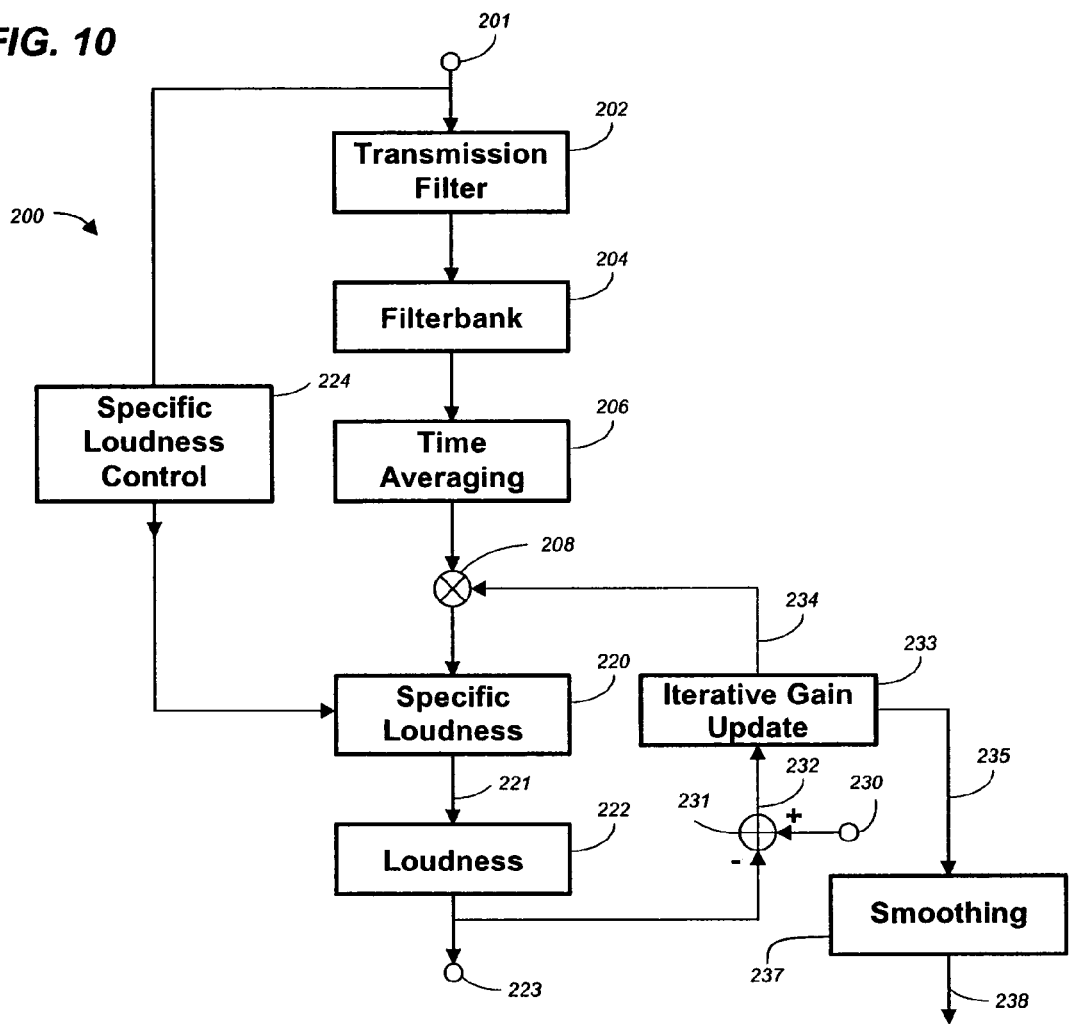
FIG. 10 is a schematic functional block diagram of an embodiment of a further aspect of the present invention.
Figure 11:
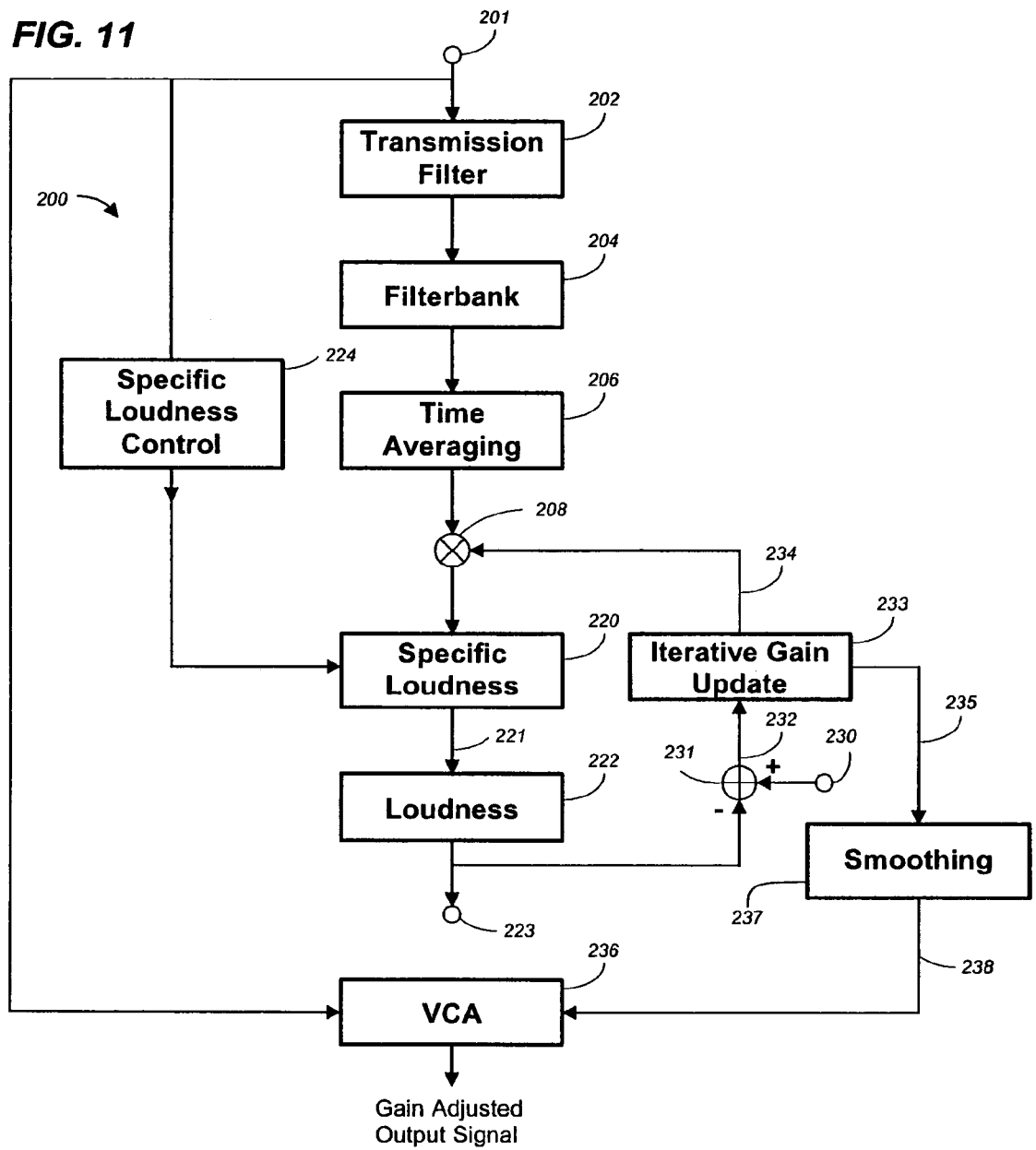
FIG. 11 is a schematic functional block diagram of an embodiment of yet a further aspect of the present invention.

FIGS. 10 and 11 display systems similar to FIGS. 2 and 3, respectively, but where smoothing (device or function 237) of the matching gain G[t] is used to generate a smoothed gain signal $G_p[t_1,t_2]$ (signal 238).

The reference loudness at input 230 (FIGS. 2, 3, 10, 11) may be "fixed" or "variable" and the source of the reference loudness may be internal or external to an arrangement embodying aspects of the invention. For example, the reference loudness may be set by a user, in which case its source is external and it may remain "fixed" for a period of time until it is re-set by the user. Alternatively, the reference loudness may be a measure of loudness of another audio source derived from a loudness measuring process or device according to the present invention, such as the arrangement shown in the example of FIG. 1.

The normal volume control of an audio-producing device may be replaced by a process or device in accordance with aspects of the invention, such as the examples of FIG. 3 or FIG. 11. In that case, the user-operated volume knob, slider, etc. would control the reference loudness at 230 of FIG. 3 or FIG. 11 and, consequently, the audio-producing device would have a loudness commensurate with the user's adjustment of the volume control.

Figure 12:
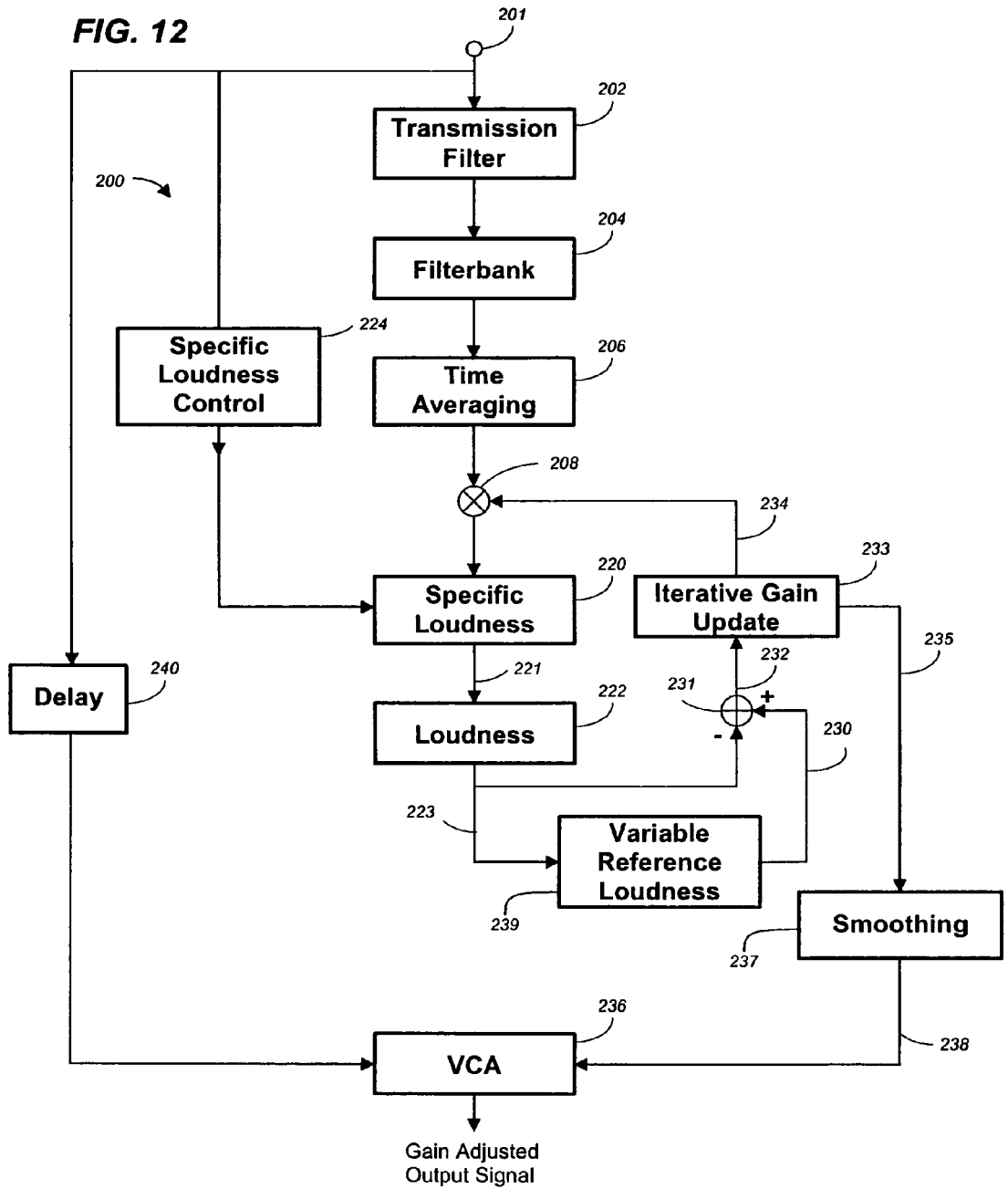
FIG. 12 is a schematic functional block diagram of an embodiment of another aspect of the present invention.

An example of a variable reference is shown in FIG. 12 where the reference loudness $S_{ref}$ is replaced by a variable reference $S_{ref}[t]$ that is computed, for example, from the loudness signal S[t] through a variable reference loudness device or function ("Variable Reference Loudness") 239. In this arrangement, at the beginning of each iteration for each time period t, the variable reference $S_{ref}[t]$ may be computed from the unmodified loudness S[t] before any gain has been applied to the excitation at 208. The dependence of $S_{ref}[t]$ and S[t] through variable loudness reference function 239 may take various forms to achieve various effects. For example, the function may simply scale S[t] to generate a reference that is some fixed ratio of the original loudness. Alternatively, the function might produce a reference greater than S[t] when S[t] is below some threshold and less than S[t] when S[t] is above some threshold, thus reducing the dynamic range of the perceived loudness of the audio. Whatever the form of this function, the previously described iteration is performed to compute G[t] such that $$\Psi_E\{G^2[t]\overline{E}[m,t]\}=S_{ref}[t] \quad (31)$$

The matching gain G[t] may then be smoothed as described above or through some other suitable technique to achieve the desired perceptual effect. Finally, a delay 240 between the audio signal 201 and VCA block 236 may be introduced to compensate for any latency in the computation of the smoothed gain. Such a delay may also be provided in the arrangements of FIGS. 3 and 11.

Figure 13:
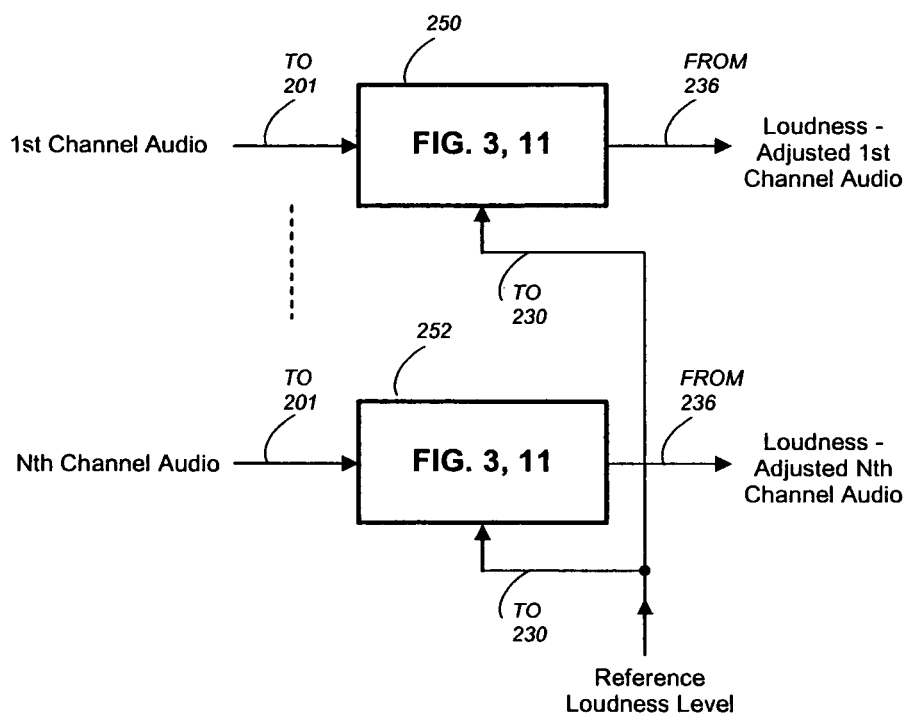
FIG. 13 is a schematic functional block diagram of an embodiment of another aspect of the present invention.

The gain control signal G[t] of the FIG. 3 arrangement and the smoothed gain control signal $G_{p[t1]}, t_2]$ of the FIG. 11 arrangement may be useful in a variety of applications including, for example, broadcast television or satellite radio where the perceived loudness across different channels varies. In such environments, the apparatus or method of the present invention may compare the audio signal from each channel with a reference loudness level (or the loudness of a reference signal). An operator or an automated device may use the gain to adjust the loudness of each channel. All channels would thus have substantially the same perceived loudness. FIG. 13 shows an example of such an arrangement in which the audio from a plurality of television or audio channels, 1 through N, are applied to the respective inputs 201 of a processes or devices 250, 252, each being in accordance with aspects of the invention as shown in FIG. 3 or 11. The same reference loudness level is applied to each of the processes or devices 250, 252 resulting in loudness-adjusted $1^{st}$ channel through Nth channel audio at each output 236.

The measurement and gain adjustment technique may also be applied to a real-time measurement device that monitors input audio material, performs processing that identifies audio content primarily containing human speech signals, and computes a gain such that the speech signals substantially matches a previously defined reference level. Suitable techniques for identifying speech in audio material are set forth in U.S. patent application Ser. No. 10/233,073, filed Aug. 30, 2002 and published as U.S. Patent Application Publication US 2004/0044525 A1, published Mar. 4, 2004. Said application is hereby incorporated by reference in its entirety. Because audience annoyance with loud audio content tends to be focused on the speech portions of program material a measurement and gain adjustment method may greatly reduce annoying level difference in audio commonly used in television, film and music material.

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described above may be order independent, and thus can be performed in an order different from that described. Accordingly, other embodiments are within the scope of the following claims.

We claim:

1. A method for processing an audio signal, comprising
calculating, in response to the audio signal, a gain value, which when multiplied with the audio signal makes the error between the perceived loudness of the audio signal and a reference loudness level within a threshold, wherein a portion of calculating said gain value is a non-linear process for which no closed form solution for said gain value exists, and wherein the calculating includes deriving from said audio signal an excitation signal divided into a plurality of frequency bands that simulate the excitation pattern along the basilar membrane of the inner ear, deriving from the excitation signal in each frequency band of the excitation signal, in said non-linear process, a specific loudness, and combining the specific loudnesses to obtain the perceived loudness,
iteratively adjusting the magnitude of the excitation signal until the error between the perceived loudness and the reference loudness is below said threshold, the iterative adjusting being performed in an iterative loop that includes deriving the specific loudness in each frequency band of the excitation signal and excludes deriving said excitation signal, and
adjusting the perceived loudness of the audio signal using the calculated gain value.

2. A method for processing a plurality of audio signals, comprising
calculating, in response to each of the audio signals, a respective gain value, which when multiplied with the audio signal makes the error between the perceived loudness of the audio signal and a reference loudness level within a threshold, the same reference loudness being applied with respect to all of the audio signals, wherein a portion of calculating said gain value is a non-linear process for which no closed form solution for said gain value exists, and wherein the calculating includes deriving from said audio signal an excitation signal divided into a plurality of frequency bands that simulate the excitation pattern along the basilar membrane of the inner ear, deriving from the excitation signal in each frequency band of the excitation signal, in said non-linear process, a specific loudness, and combining the specific loudnesses to obtain the perceived loudness,
iteratively adjusting the magnitude of the excitation signal until the error between the perceived loudness and the reference loudness is below said threshold, the iterative adjusting being performed in an iterative loop that includes deriving the specific loudness in each frequency band of the excitation signal and excludes deriving said excitation signal, and adjusting the perceived loudness of each audio signal using the respective calculated gain value.

3. The method of claim 1 wherein the iterative processing loop includes calculating a perceptual loudness.

4. The method of claim 1 wherein said non-linear process includes a specific loudness calculation that selects, from a group of two or more specific loudness model functions, one or a combination of two or more of said specific loudness model functions, the selection of which is controlled by the input audio signal.

5. The method of claim 1 wherein the excitation signal is time smoothed and/or the method further comprises time smoothing the gain value.

6. The method of claim 5 wherein the excitation signal is linearly time smoothed.

7. The method of claim 5 wherein the method further comprises smoothing the gain value said smoothing employing a histogram technique.

8. The method of claim 1 wherein the iterative processing loop includes time smoothing.

9. A method according to claim 1 or claim 4, wherein the iterative processing loop includes
adjusting the magnitude of the excitation signal in response to a function of an iteration gain value such that the adjusted magnitude of the excitation signal increases with increasing gain values, and decreases with decreasing gain values,
calculating a perceptual loudness in response to the magnitude-adjusted excitation signal,
comparing the calculated perceptual loudness of the audio signal to a reference perceptual loudness to generate a difference, and
adjusting the gain value in response to the difference so as to reduce the difference between the calculated perceptual loudness and the reference perceptual loudness.

10. A method according to claim 9, wherein the iterative processing loop, in accordance with a minimization algorithm,
repetitively adjusts the magnitude of the excitation signal,
calculates a perceptual loudness,
compares the calculated perceptual loudness to a reference perceptual loudness, and
adjusts the gain value to a final gain value.

11. A method according to claim 10, wherein
the minimization algorithm is in accordance with the gradient descent method of minimization.

12. A method according to claim 1, further comprising
controlling the amplitude of the input audio signal with the final gain value so that the resulting perceived loudness of the input audio signal is substantially the same as the reference loudness.

13. A method according to claim 12 wherein the reference loudness is set by a user.

14. A method according to claim 1 wherein producing, in response to the audio signal, an excitation signal, comprises
linearly filtering the audio signal by a function or functions that simulate the characteristics of the outer and middle human ear to produce a linearly-filtered audio signal, and
dividing the linearly-filtered audio signal into frequency bands that simulate the excitation pattern generated along the basilar membrane of the inner ear to produce the excitation signal.

15. A method according to claim 1 wherein
said at least one non-linear process includes calculating the specific loudness in each frequency band of the excitation signal.

16. A method according to claim 15 wherein
said calculating the specific-loudness in each frequency band of the excitation signal selects from a group of two or more specific loudness model functions, one or a combination of two or more of said specific loudness model functions, the selection of which is controlled by the measure of characteristics of the input audio signal.

17. A method according to claim 9 wherein calculating a perceptual loudness in response to the magnitude-adjusted excitation signal includes calculating the specific loudness in respective frequency bands of the excitation signal.

18. A method according to claim 17 wherein said calculating the specific loudness in each frequency band of the excitation signal selects, from a group of two or more specific loudness model functions, one or a combination of two or more of the specific loudness model functions, the selection of which is controlled by the measure of characteristics of the input audio signal.

19. A method according to claim 18 wherein calculating a perceptual loudness in response to the magnitude-adjusted excitation signal further comprises combining the specific loudness for each frequency band into a measure of perceptual loudness.

20. A method according to claim 9 wherein the reference perceptual loudness is derived from a measure of the calculated perceptual loudness.

21. A method according to claim 20 wherein the reference perceptual loudness is a scaled version of the calculated perceptual loudness.

22. A method according to claim 20 wherein the reference perceptual loudness is greater than the calculated perceptual loudness when the calculated perceptual loudness is below a threshold and less than the calculated perceptual loudness when the calculated perceptual loudness is above a threshold.

23. Apparatus adapted to perform the methods of claim 1 or claim 2.

24. A non-transitory computer-readable storage medium encoded with a computer program for causing a computer to perform the method of claim 1 or claim 2.

* * * * *